(12) United States Patent
Kang

(10) Patent No.: US 12,740,175 B2
(45) Date of Patent: Sep. 15, 2026

(54) IMAGE SENSOR AND METHOD OF MANUFACTURING IMAGE SENSOR

(71) Applicant: Samsung Electronics Co., Ltd., Suwon-si (KR)

(72) Inventor: Jeong Soon Kang, Gumi-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 574 days.

(21) Appl. No.: 17/834,365

(22) Filed: Jun. 7, 2022

(65) Prior Publication Data

US 2023/0073145 A1 Mar. 9, 2023

(30) Foreign Application Priority Data

Sep. 8, 2021 (KR) ........................ 10-2021-0119598

(51) Int. Cl.
*H01L 27/146* (2006.01)
*H10F 39/00* (2025.01)
(Continued)

(52) U.S. Cl.
CPC ......... *H10F 39/809* (2025.01); *H10F 39/014* (2025.01); *H10F 39/018* (2025.01);
(Continued)

(58) Field of Classification Search
CPC .... H10F 39/809; H10F 39/014; H10F 39/018; H10F 39/80373; H10F 39/182; H10F 39/8053; H10F 39/8063; H10F 39/802; H10F 39/811; H01L 24/05; H01L 24/06; H01L 24/08; H01L 2224/05571; H01L 2224/05616; H01L 2224/05647; H01L 2224/06517; H01L 2224/08147; H01L 27/14634; H01L 27/14614; H01L 27/14689; H01L 27/1469; H01L 27/14621; H01L 27/14627; H01L 27/14645
See application file for complete search history.

(56) References Cited

U.S. PATENT DOCUMENTS

| | | | |
|---|---|---|---|
| 9,564,464 | B2 | 2/2017 | Madurawe et al. |
| 10,957,732 | B2 | 3/2021 | Ryoki et al. |

(Continued)

FOREIGN PATENT DOCUMENTS

| | | |
|---|---|---|
| CN | 112689900 A | 4/2021 |
| CN | 112868102 A | 5/2021 |
| JP | 2020-047616 A | 3/2020 |

*Primary Examiner* — Ermias T Woldegeorgis
(74) *Attorney, Agent, or Firm* — Harness, Dickey & Pierce, P.L.C.

(57) ABSTRACT

An image sensor is provided, the image sensor comprises a first semiconductor substrate; a photoelectric conversion layer in the first semiconductor substrate; a color filter on a first surface of the first semiconductor substrate; a micro lens covering the color filter; a first transistor on the first semiconductor substrate; a first insulating layer on a second surface; a second semiconductor substrate in contact with the first insulating layer, the second semiconductor substrate including a gate trench exposing at least a portion of the first gate structure; a second transistor on the second semiconductor substrate; a second insulating layer on the fourth surface; and a metal layer in the second insulating layer.

14 Claims, 25 Drawing Sheets

(51) Int. Cl.
*H10F 39/18* (2025.01)
*H10W 72/90* (2026.01)
*H10W 90/00* (2026.01)

(52) U.S. Cl.
CPC ..... *H10F 39/80373* (2025.01); *H10F 39/182* (2025.01); *H10F 39/8053* (2025.01); *H10F 39/8063* (2025.01); *H10W 72/9415* (2026.01); *H10W 72/952* (2026.01); *H10W 72/963* (2026.01); *H10W 72/967* (2026.01); *H10W 90/792* (2026.01)

(56) References Cited

U.S. PATENT DOCUMENTS

| | | | | |
|---|---|---|---|---|
| 2018/0033809 | A1* | 2/2018 | Tayanaka | H04N 25/583 |
| 2019/0019824 | A1 | 1/2019 | Tanaka et al. | |
| 2020/0266229 | A1* | 8/2020 | Takahashi | H01L 27/14636 |
| 2021/0084249 | A1 | 3/2021 | Nakazawa et al. | |

* cited by examiner

IMAGE SENSOR AND METHOD OF MANUFACTURING IMAGE SENSOR

CROSS-REFERENCE TO RELATED APPLICATION

This application claims priority from Korean Patent Application No. 10-2021-0119598 filed on Sep. 8, 2021 in the Korean Intellectual Property Office, and all the benefits accruing therefrom under 35 U.S.C. 119, the contents of which are herein incorporated by reference in its entirety.

BACKGROUND

Technical Field

The present disclosure relates to an image sensor and a method of manufacturing an image sensor.

Description of the Related Art

An image sensing device may be (and/or include) semiconductor elements that convert optical information into an electrical signal. The image sensing device may include a charge coupled device (CCD) image sensing device and a complementary metal-oxide semiconductor (CMOS) image sensing device.

The CMOS image sensor may be abbreviated as a CIS (CMOS image sensor). The CIS may include a plurality of pixels, e.g., arranged in two-dimensions (2D) (e.g., in a 2D array). Each of the pixels may include, for example, a photodiode (PD). The photodiode may serve to convert incident light into an electrical signal.

Recently, with the development of computer industry, communication industry, and other various fields, electric devices, such as a digital camera, a camcorder, a smart phone, a game device, a security camera, a medical micro camera, and/or a robot, have been developed to satisfy high capacity and miniaturization requirements. To this end, studies for integrating a plurality of chips stacked in a three-dimensional direction into one image sensing device are ongoing.

SUMMARY

At least one example embodiment of the present disclosure is to provide an image sensor that includes gate structures formed by varying vertical positions in the same manufacturing step.

At least one example embodiment of the present disclosure is to provide an image sensor in which gate structures are formed by varying vertical positions in the same manufacturing step.

The example embodiments of the present disclosure are not limited to those mentioned above, and additional embodiments of the present disclosure, which are not mentioned herein, will be clearly understood by those skilled in the art from the following description of the present disclosure.

An image sensor according to some embodiments of the present disclosure devised to achieve the above objects comprises a first semiconductor substrate including a first surface and a second surface opposite to the first surface; a photoelectric conversion layer in the first semiconductor substrate; a color filter on the first surface of the first semiconductor substrate; a micro lens covering the color filter; a first transistor on the second surface, the first transistor including a first gate structure adjacent to the photoelectric conversion layer; a first insulating layer on the second surface; a second semiconductor substrate including a third surface in contact with the first insulating layer and a fourth surface opposite to the third surface, the second semiconductor substrate including a gate trench exposing at least a portion of the first gate structure; a second transistor on the fourth surface, the second transistor including a second gate structure; a second insulating layer on the fourth surface; and a metal layer in the second insulating layer, wherein a lower surface of the second gate structure is on the fourth surface, and an upper surface of the second gate structure and an upper surface of the first gate structure extend in a direction parallel to a surface of the second insulating layer.

An image sensor according to some embodiments of the present disclosure devised to achieve the above objects comprises a first semiconductor substrate including a first surface and a second surface opposite to the first surface; a photoelectric conversion layer in the first semiconductor substrate; a color filter on the first surface; a micro lens covering the color filter; a first transistor on the second surface of the first semiconductor substrate, the first transistor including a first gate structure adjacent to the photoelectric conversion layer; a first insulating layer on the second surface; a second semiconductor substrate including a third surface, which is in contact with the first insulating layer, and a fourth surface opposite to the third surface, the second semiconductor substrate including a gate trench exposing the first gate structure; a second transistor on the fourth surface of the second semiconductor substrate, the second transistor including a second gate structure; a second insulating layer on the fourth surface of the second semiconductor substrate; and a metal layer in the second insulating layer, where the first gate structure protrudes past the fourth surface.

A method of manufacturing an image sensor according to some embodiments of the present disclosure devised to achieve the above objects comprises providing a first semiconductor substrate; forming a stacked structure on first semiconductor substrate, the stacked structure including a first insulating layer on the first semiconductor substrate and a second semiconductor substrate on the first insulating layer; forming a gate trench in the stacked structure such that the gate trench exposes at least a portion of the first semiconductor substrate; forming a first transistor on the portion of the first semiconductor substrate exposed by the gate trench, the first transistor including a first gate structure; forming a second transistor on a surface of the semiconductor substrate, the second transistor including a second gate structure; forming a second insulating layer covering the first and second transistors; forming a first contact passing through the second insulating layer such that the first contact contacts with the first gate structure; forming a second contact passing through the first and second insulating layers such that the second contact contacts with the second gate structure; and forming a metal layer on the second insulating layer such that the metal layer contacts with the first and second contacts.

BRIEF DESCRIPTION OF THE DRAWINGS

The above and other aspects and features of the present disclosure will become more apparent by describing in detail some example embodiments thereof with reference to the attached drawings, in which.

DETAILED DESCRIPTION OF THE DISCLOSURE

Figure 1:
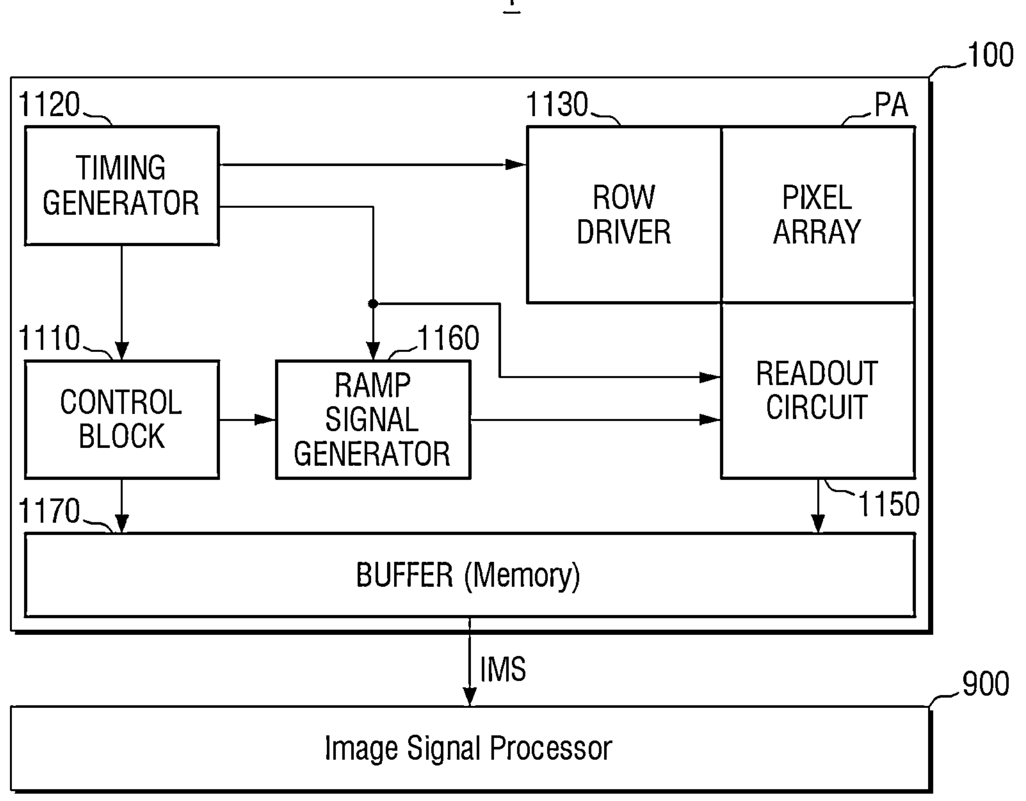
FIG. 1 is a block view illustrating an image sensing device according to some embodiments of the present disclosure.

Hereinafter, some example embodiments according to technical spirits of the present disclosure will be described with reference to the accompanying drawings. In description of FIGS. 1 to 25, the same reference numerals are used for the substantially same elements, and a repeated description of the corresponding elements will be omitted. Also, similar reference numerals are used for similar elements through the drawings of the present disclosure.

In the description, spatially relative terms such as "lower", "upper," "above," "under," etc. may be used herein for ease of description to describe one element's relationship to another element. Such spatially relative terms are intended to encompass different orientations of the device in use or operation in addition to the orientation depicted in the figures. For example, the device may also be oriented in other ways (for example, turned over, and/or rotated 90 degrees and/or at other orientations), and the spatially relative terms used herein are to be interpreted accordingly.

Additionally, although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

FIG. 1 is a block view illustrating an image sensing device according to some embodiments of the present disclosure. Referring to FIG. 1, an image sensing device 1 may include an image sensor 100 and an image processor 900.

The image sensor 100 may generate an image signal IMS by sensing an image of a sensing target using light. In some embodiments, the generated image signal IMS may be, for example, a digital signal, but the examples are not limited thereto.

The image signal IMS may be provided to the image processor 900 and then processed by the image processor 900. The image processor 900 may receive the image signal IMS output from a buffer 1170 of the image sensor 100 and process the received image signal IMS, e.g., to be easily displayed.

The image signal IMS output from the image sensor 100 may be a raw image signal from a pixel array PA without analog binning, and/or may be the image signal IMS for which analog binning has been already performed. In some embodiments, the image processor 900 may perform digital binning for the image signal IMS output from the image sensor 100.

In some embodiments, the image sensor 100 and the image processor 900 may be disposed to be separated from each other (e.g., as shown). For example, the image sensor 100 may be embedded in one chip, and the image processor 900 may be embedded in a separate chip, whereby the image sensor 100 and the image processor 900 may perform communication with each other through an interface. However, the examples are not limited to this example, and the image sensor 100 and the image processor 900 may be implemented in a (e.g., one) package, for example, a multi-chip package (MCP).

The image sensor 100 may include a control register block 1110, a timing generator 1120, a row driver 1130, a pixel array PA, a readout circuit 1150, a ramp signal generator 1160, and a buffer 1170.

The control register block 1110 may control overall operations of the image sensor 100. For example, the control register block 1110 may transmit an operation signal to the timing generator 1120, the ramp signal generator 1160, and/or the buffer 1170.

The timing generator 1120 may generate a reference signal that becomes a reference of an operation timing of various elements of the image sensor 100. The operation timing reference signal generated by the timing generator 1120 may be transferred to the row driver 1130, the readout circuit 1150, the ramp signal generator 1160, etc.

The ramp signal generator 1160 may generate and transmit a ramp signal used in the readout circuit 1150. For example, the readout circuit 1150 may include a correlation double sampler (CDS), a comparator, etc. The ramp signal generator 1160 may generate and transmit a ramp signal used in the correlation double sampler (CDS), the comparator, etc.

The buffer 1170 may include, for example, a latch. For example, the buffer 1170 may use the latch to protect and/or maintain consistency in an index and/or data pages for an object. The buffer 1170 may temporarily store the image signal IMS that will be provided to the outside and may transmit the image signal IMS to, e.g., an external memory and/or an external device. The buffer 1170 may include a memory cell, such as a dynamic random access memory (DRAM) device, a static random access memory (SRAM) device, a spin transfer torque magnetic random access memory (STT-MRAM) device, and/or a flash memory device, but the embodiments are not limited thereto.

The pixel array PA may sense light from an external image. The pixel array PA may include a plurality of pixels (and/or unit pixels). For example, the pixel array PA may convert light received by the plurality of pixels to generate a pixel signal. The pixel signal may be an analog signal and may include data about the external image. The row driver 1130 may selectively enable rows of the pixel array PA.

The readout circuit 1150 may sample the pixel signal provided from the pixel array PA, compare the sampled pixel signal with the ramp signal and then convert an analog image signal (data) into a data image signal (data) based on the compared result.

Figure 2:
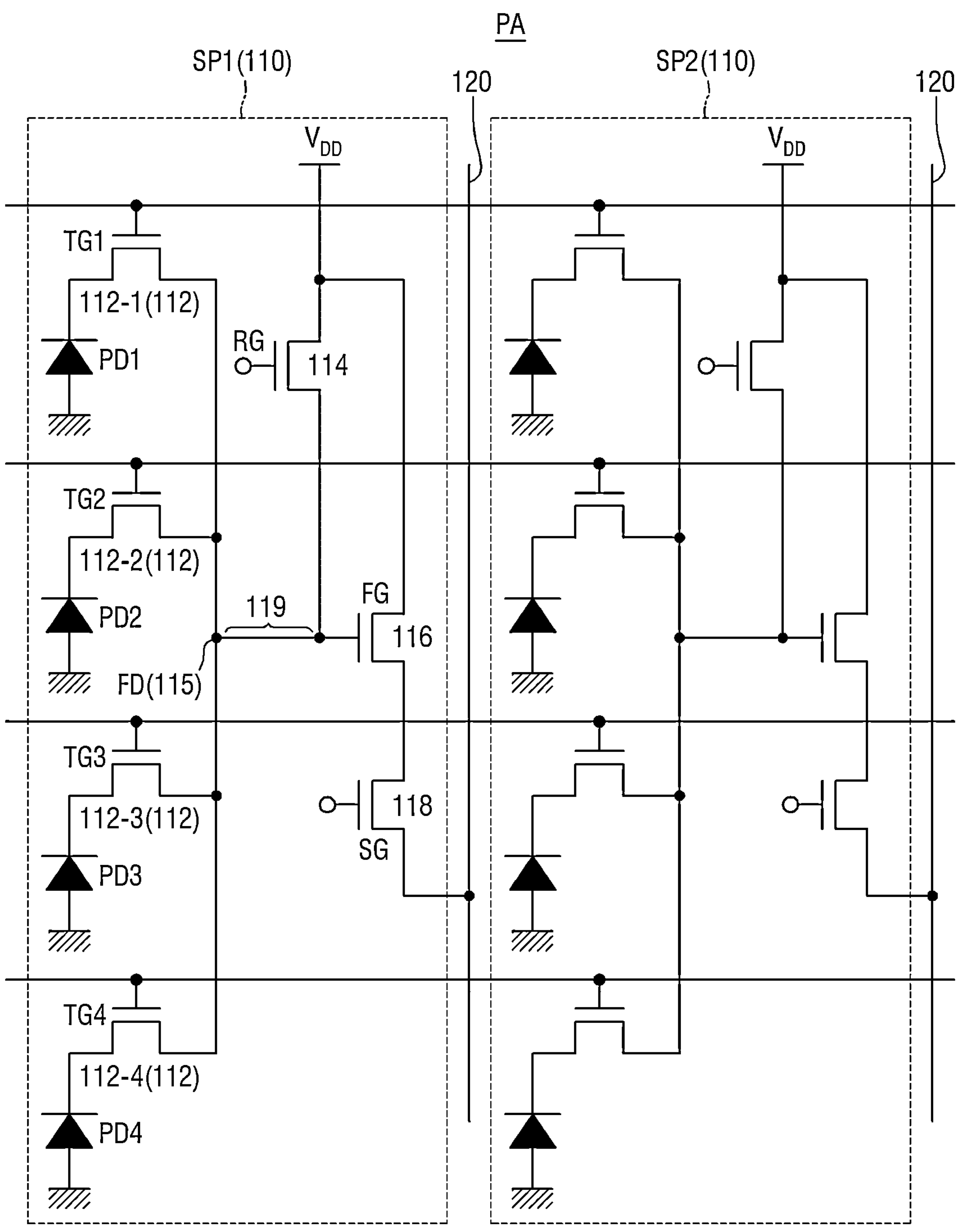
FIGS. 2 and 3 are a circuit view and a schematic plan view illustrating a unit pixel of a pixel array.
Figure 3:
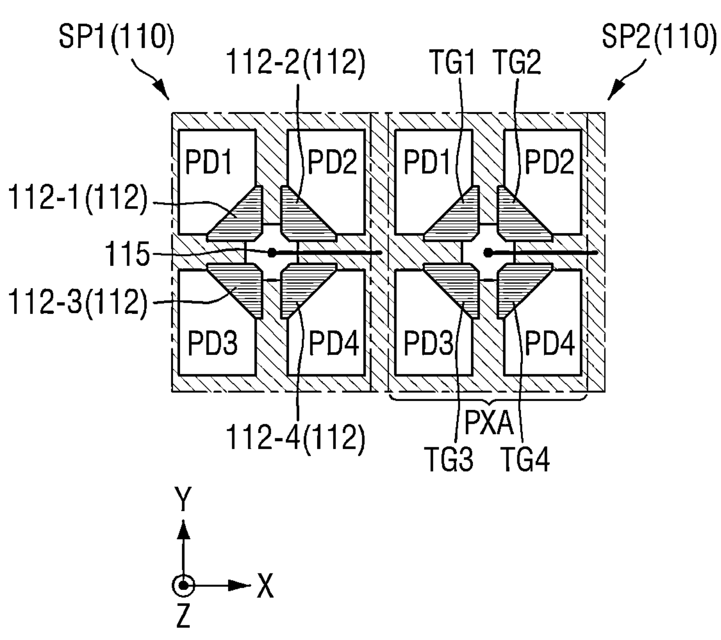
Figure 4:
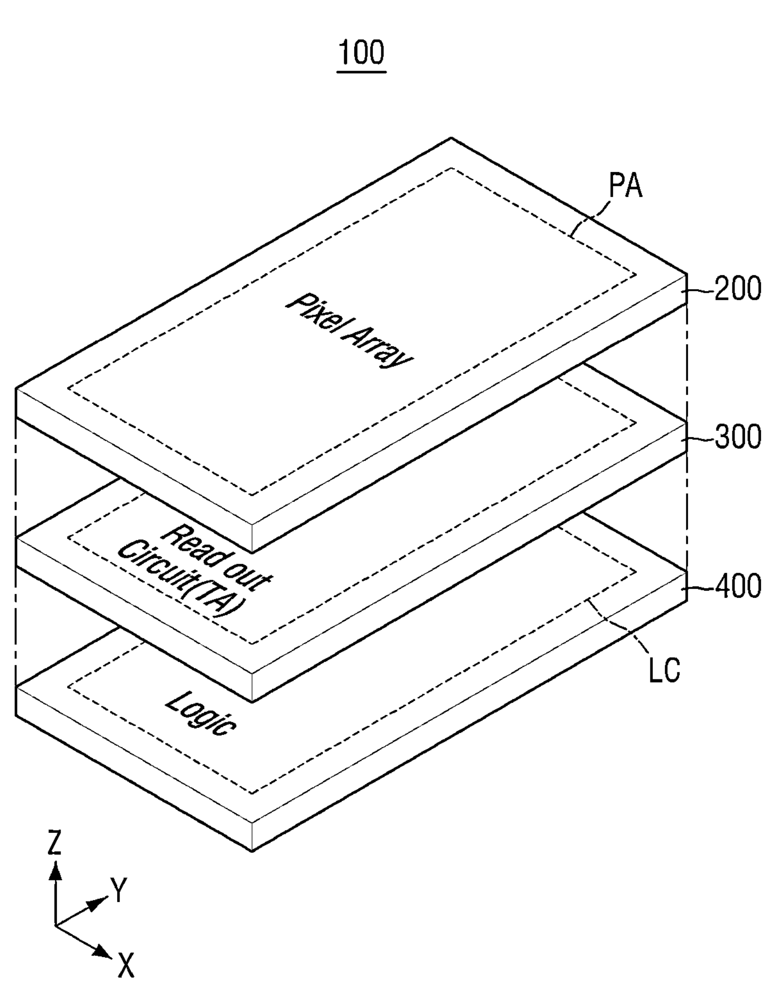
FIG. 4 is a view illustrating a conceptual layout of an image sensor according to some embodiments of the present disclosure.

FIGS. 2 and 3 are a circuit view and a schematic plan view illustrating a unit pixel of a pixel array. FIG. 4 is a view illustrating a conceptual layout of an image sensor according to some embodiments of the present disclosure.

Referring to FIGS. 2 and 3, in the image sensor 100 of some example embodiments, 4-shared pixels 110 may be disposed in the pixel array PA in a two-dimensional array structure. For clarity, only two 4-shared pixels SP1 and SP2 adjacent to each other in a first direction X are shown in FIG. 3, but the examples are not limited thereto. For example, a plurality of 4-shared pixels 110 may be disposed in the pixel array PA in a two-dimensional array structure along the first direction X and a second direction Y crossing the first direction X.

Referring to FIGS. 2 and 4, in the image sensor 100 of some example embodiments, the 4-shared pixels may be disposed in a pixel area PXA, and transistors 114, 116, and 118 (e.g., except transmission transistors 112) may be disposed in a transistor area TA. Four pixels may constitute one 4-shared pixel. For example, the first 4-shared pixel SP1 may have a structure in which four photodiodes PD1 to PD4 share one floating diffusion (FD) region 115 while surrounding the one floating diffusion (FD) region 115. Similarly, the second 4-shared pixel SP2 may also have a structure in which the four photodiodes PD1 to PD4 share a floating diffusion region 115.

In some example embodiments, one photodiode (e.g., one of PD1 to PD4) may constitute one pixel, and the transistor area TA including the transistors 114, 116, and 118 may be disposed to overlap the pixel area PXA in a third direction Z.

In the 4-shared pixel 110, sharing of one floating diffusion region 115 by the four photodiodes PD1 to PD4 may be implemented through the transmission transistors 112 respectively corresponding to the photodiodes PD1 to PD4. For example, a first transmission transistor 112-1 corresponding to the first photodiode PD1, a second transmission transistor 112-2 corresponding to the second photodiode PD2, a third transmission transistor 112-3 corresponding to the third photodiode PD3, and a fourth transmission transistor 112-4 corresponding to the fourth photodiode PD4 may share the floating diffusion region 115 as a common drain region.

Meanwhile, in the 4-shared pixel 110, the four photodiodes PD1 to PD4 may share the transistors 114, 116, and 118. The transistors 114, 116, and 118 may include a reset transistor 114, a source follower transistor 116, and/or a selection transistor 118. The four photodiodes PD1 to PD4 constituting the 4-shared pixel 110 may share a reset transistor 114, a source follower transistor 116, and a selection transistor 118. The reset transistor 114, the source follower transistor 116, and the selection transistor 118 may be disposed in the transistor area TA along the first direction X or the second direction Y, but the embodiments are not limited thereto.

Referring to FIG. 2, the four photodiodes PD1 to PD4 may be connected to source regions of the corresponding four transmission transistors 112, respectively. A drain region of each of the transmission transistors 112 may be connected to a source region of the reset transistor 114. The common drain region of the transmission transistors 112 may correspond to the floating diffusion region 115. The floating diffusion region 115 may be connected to a gate electrode of the source follower transistor 116 (e.g., may be connected to the source follower gate electrode FG) and the source region of the reset transistor 114 through a line 119. A sharing point of a drain region of the reset transistor 114 and a drain region of the source follower transistor 116 may be connected to a power voltage VDD. A source region of the source follower transistor 116 and a drain region of the selection transistor 118 may be shared with each other, and a column signal line 120 may be connected to the source region of the selection transistor 118. A voltage of the source region of the selection transistor 118 may be output to the column signal line 120 as an output signal.

In some example embodiments, a unit pixel constituting the pixels 110 of the pixel array PA may include four pixels that are shared, and the transistors 114, 116, and 118 of the transistor area TA corresponding to the four pixels. In addition, the unit pixel may include transmission transistors 112 corresponding to the number of shared photodiodes.

However, the structure of the unit pixel of the pixel array PA is not limited to the 4-shared pixel structure. In some example embodiments, the pixel structure may include a pixel structure including $2^n$-shared pixels and pixel transistors corresponding to each of the pixels of the pixel structure, where n is an integer. For example, the unit pixel of the pixel array PA may be a 2-shared pixel structure including two pixels and pixel transistors corresponding to the two pixels, and/or an 8-shared pixel structure including eight pixels and pixel transistors corresponding to the eight pixels.

Referring to FIG. 4, the image sensor 100 may include an upper chip 200, an intermediate chip 300, and/or a lower chip 400. The lower chip 400, the intermediate chip 300, and the upper chip 200 may sequentially be stacked in the third direction Z. A plurality of pixels may be disposed in the upper chip 200 in a two-dimensional array structure. For example, the upper chip 200 may include a pixel area PXA (see FIGS. 2 and 3) of the pixel array PA.

The intermediate chip 300 may include the transistors 114, 116, and 118 (see FIG. 2) corresponding to the read-out circuit 1150 (see FIG. 1), included in the transistor area TA. The lower chip 400 may include logic elements included in a logic region LC. The intermediate chip 300 may transfer the pixel signal transferred from the upper chip 200 to the logic region LC of the lower chip 400.

The logic elements may be disposed in the logic region LC of the lower chip 400. The logic elements may include circuits for processing pixel signals received from pixels. For example, the control register block 1110, the timing generator 1120, the row driver 1130, the read out circuit 1150, and/or the ramp signal generator 1160 of FIG. 1 may be included in the logic elements.

In addition, the lower chip 400 may include a memory region. The memory region may include, e.g., memory cells such as a dynamic random access memory (DRAM) device, a static random access memory (SRAM) device, a spin transfer torque magnetic random access memory (STT-MRAM) device, and/or a flash memory device. The memory cells may be disposed in the memory region in a two-dimensional array structure and/or a three-dimensional array. For example, a plurality of memory cells may be disposed in the memory region in a two-dimensional array structure and/or three-dimension and may be formed in an embedded type.

The memory may be used as an image buffer memory for storing a frame image. For example, the image sensor 100 may temporarily store the frame image using the memory and perform signal processing, thereby minimizing a Jello effect and improving operational characteristics of the image sensor 100. In addition, the memory of the image sensor 100 may be formed with logic devices in an embedded type, thereby simplifying a manufacturing process and reducing a size of the product.

Figure 5:
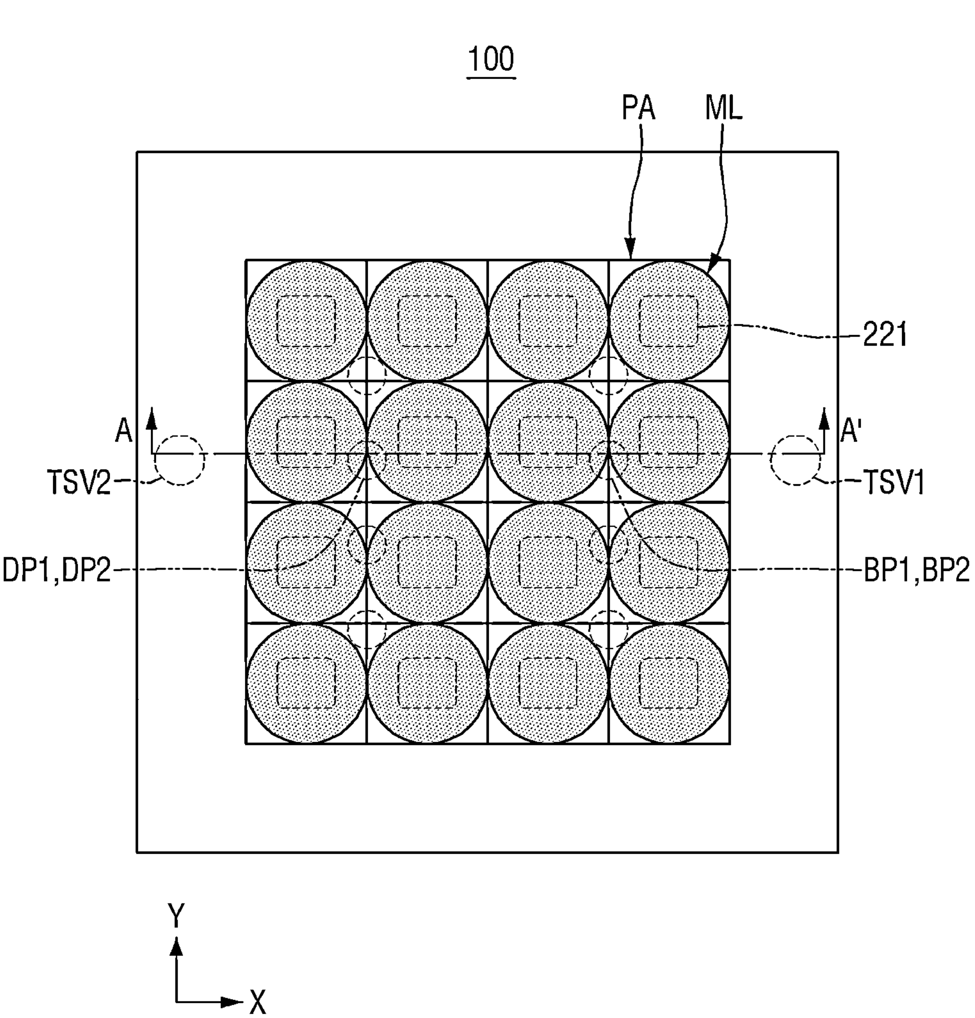
FIG. 5 is a top view illustrating the image sensor of FIG. 4.
Figure 6:
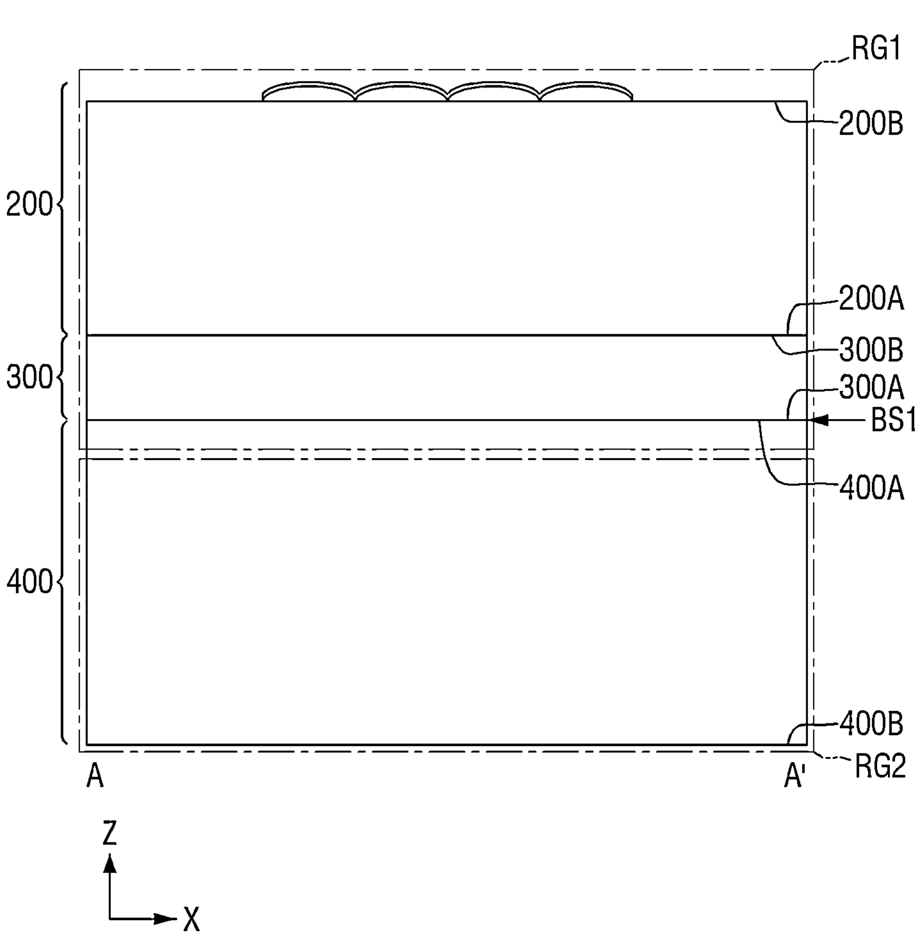
FIG. 6 is a cross-sectional view illustrating an image sensor, taken along line A-A of FIG. 5.
Figure 7:
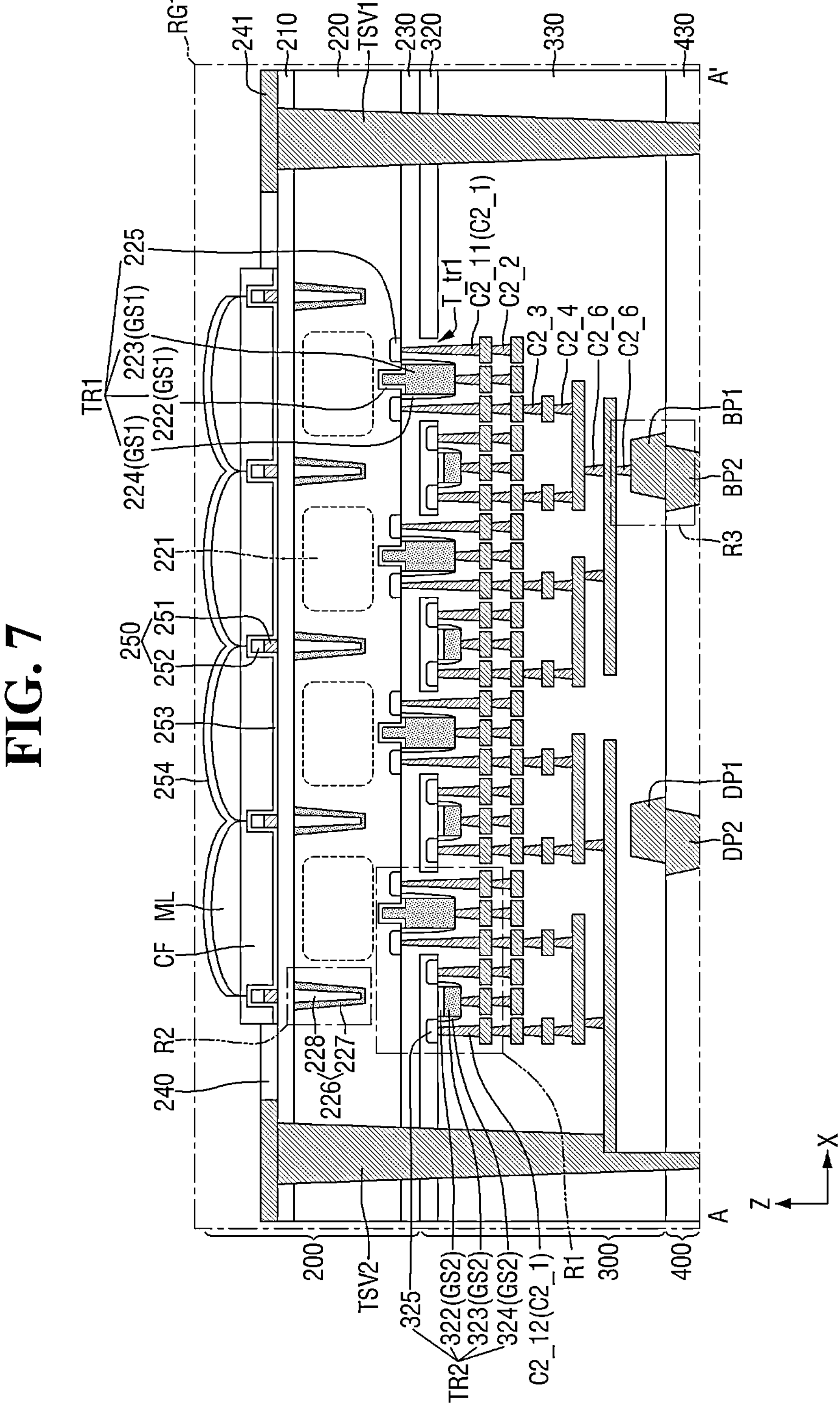
FIG. 7 is an enlarged view illustrating a region RG1 of FIG. 6.
Figure 8:
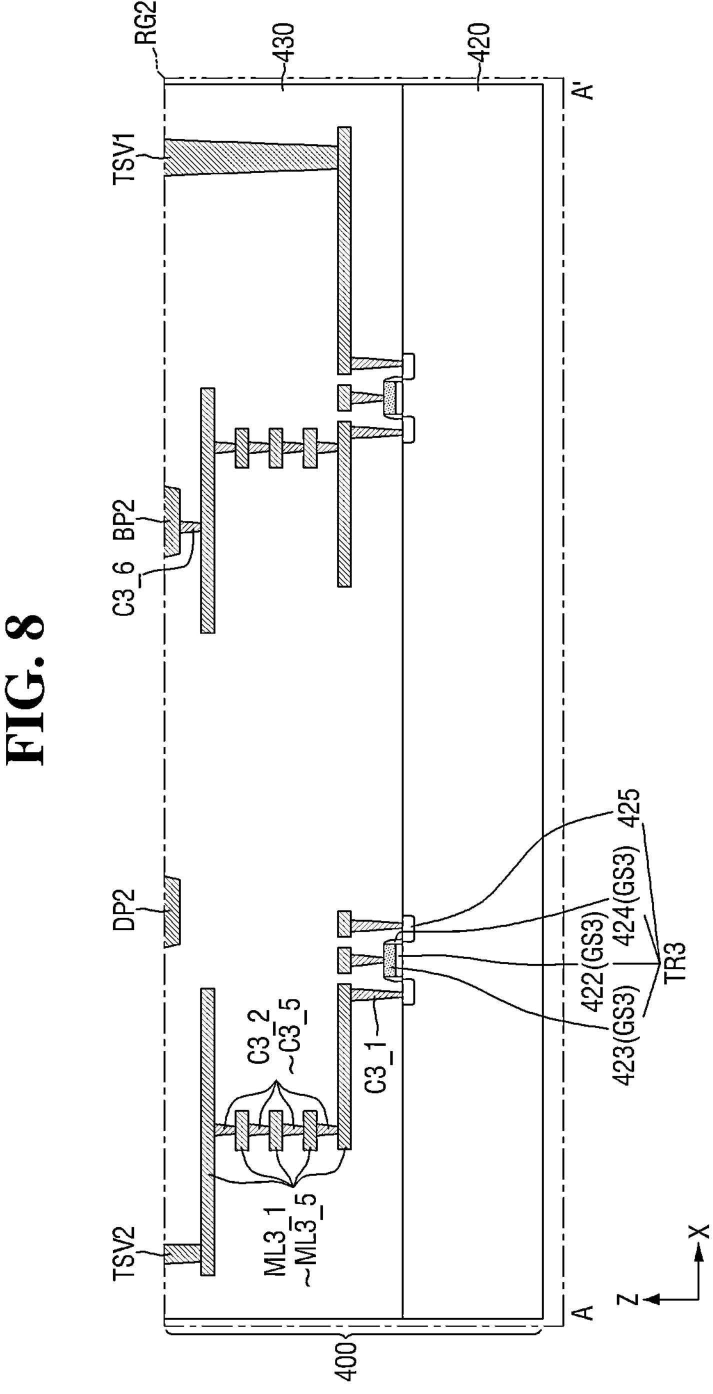
FIG. 8 is an enlarged view illustrating a region RG2 of FIG. 6.
Figure 9:
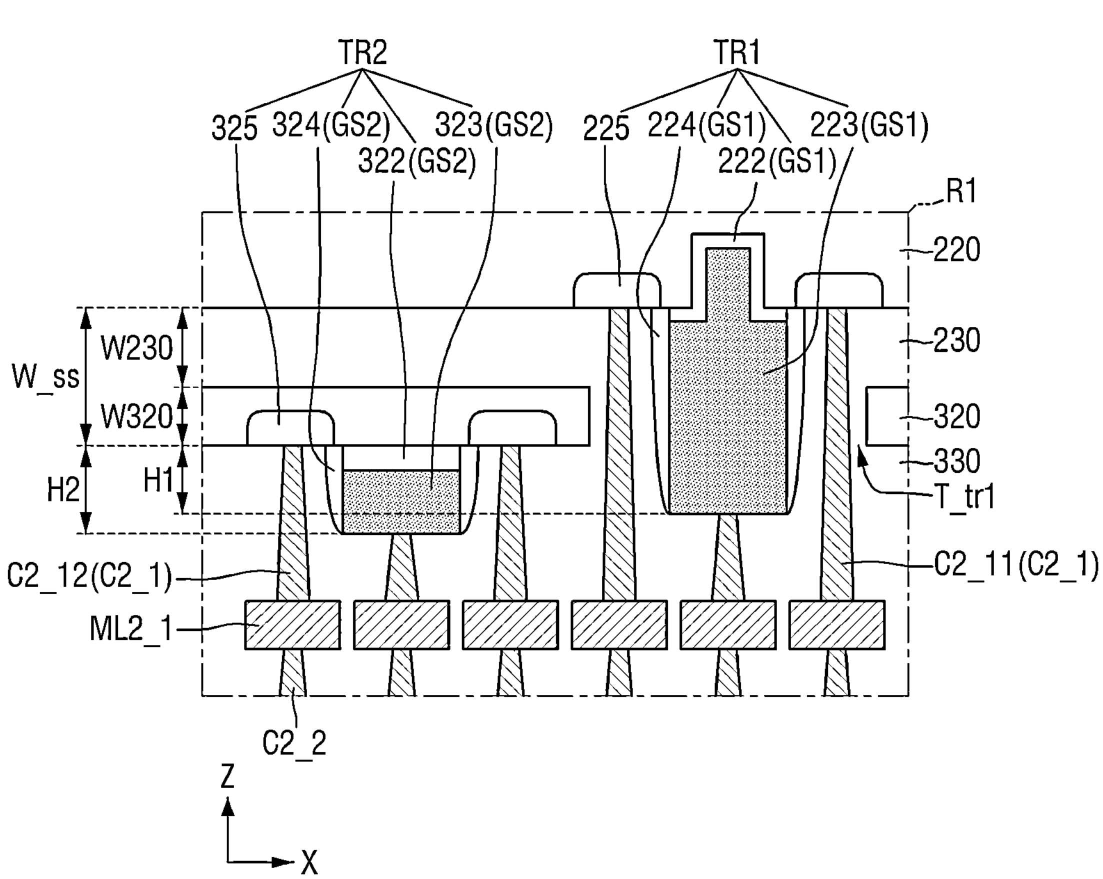
FIG. 9 is an enlarged view illustrating a region R1 of FIG. 7.
Figure 10:
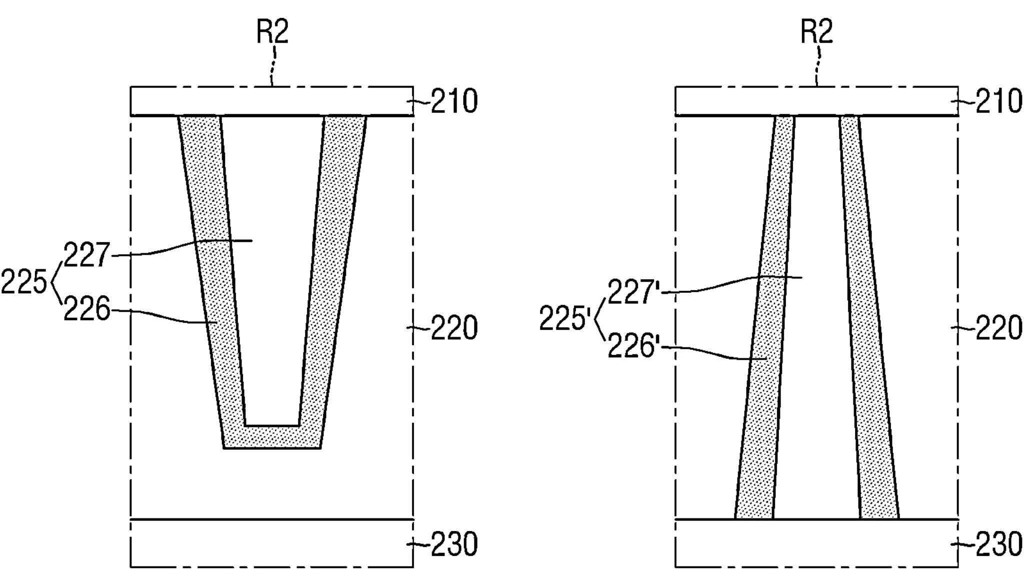
FIG. 10 is an enlarged view illustrating a region R2 of FIG. 7.
Figure 11:
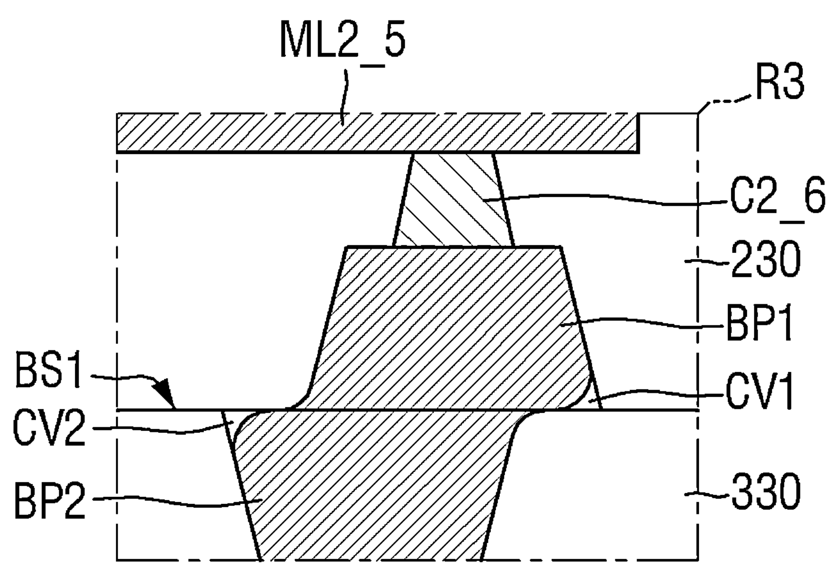
FIGS. 11 and 12 are enlarged views illustrating a region R3 of FIG. 7.
Figure 12:
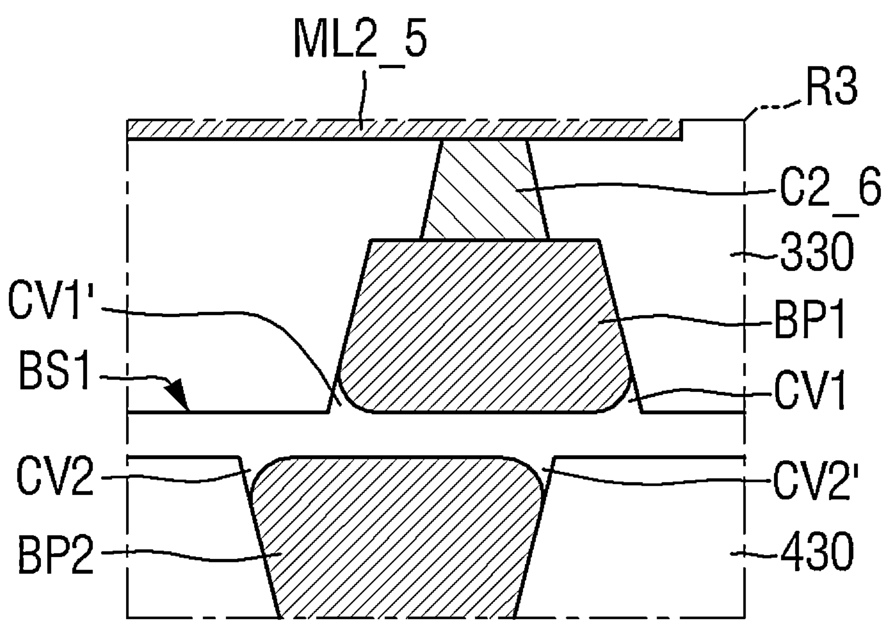

FIG. 5 is a top view illustrating an image sensor of FIG. 4. FIG. 6 is a cross-sectional view illustrating an image sensor taken along line A-A of FIG. 5. FIG. 7 is an enlarged view illustrating a region RG1 of FIG. 6. FIG. 8 is an enlarged view illustrating a region RG2 of FIG. 6. FIG. 9 is an enlarged view illustrating a region R1 of FIG. 7. FIG. 10 is an enlarged view illustrating a region R2 of FIG. 7. FIGS. 11 and 12 are enlarged views illustrating a region R3 of FIG. 7.

Referring to FIGS. 5 and 6, the pixel array PA may be disposed on an upper surface of the image sensor 100. For example, the pixel array PA may be disposed on a rear surface 200B of the upper chip 200 of the image sensor 100. In this case, a first through via THV1 and a second through via THV2 may be disposed in an outer region of a region in which the pixel array PA is disposed, wherein at least a portion of bonding pads BP1 and BP2 and dummy pads DP1 and DP2, which connect the intermediate chip 300 with the lower chip 400, may be disposed to two-dimensionally overlap the region in which the pixel array PA is disposed. A micro lens ML may be disposed in the region where the pixel array PA is disposed. Although only a portion of the bonding pads BP1 and BP2 is disposed in the region in which the pixel array PA is disposed, the embodiments are not limited thereto.

Referring to FIGS. 6 to 12, the image sensor 100 may include an upper chip 200, an intermediate chip 300, and a lower chip 400. The lower chip 400 and the upper chip 200 may be sequentially stacked in the third direction Z.

The upper chip 200 may include a first semiconductor substrate 220, a photoelectric conversion layer 221, a first transistor TR1, a pixel separation pattern 226, and/or the like.

The first semiconductor substrate 220 may be (and/or include), for example, an elemental and/or a compound semiconductor. For example, the first semiconductor 220 may be (and/or include) a bulk silicon and/or silicon-on-insulator (SOI). The first semiconductor substrate 220 may be a silicon substrate, or may include another material, for example, silicon germanium, indium antimonide, lead telluride, indium arsenic, indium phosphide, gallium arsenide, gallium antimonide, and/or the like. In some embodiments, the first semiconductor substrate 220 may be an epi-layer formed on a base substrate. The first semiconductor substrate 220 may include a front surface and a rear surface, which are opposite to each other. In some embodiments, the rear surface of the first semiconductor substrate 220, which corresponds to the rear surface 200B of the upper chip 200, may be a light-receiving surface on which light is incident.

In some embodiments, the first transistor TR1 may be disposed on the front surface of the first semiconductor substrate 220. The first transistor TR1 may include, for example, a transistor constituting a unit pixel of the image sensor. The first transistor TR1 may be a transmission transistor formed to be adjacent to the photoelectric conversion layer 221 but is not limited thereto.

The first transistor TR1 may include a gate insulating layer 222, a gate electrode 223, a gate spacer 224, and an impurity implantation region 225. The gate insulating layer 222 may be formed along a trench formed in the first semiconductor substrate 220. The gate electrode 223 may fill a region defined by the gate insulating layer 222 and the gate spacer 224. The impurity implantation region 225 may be formed by doping impurities in the first semiconductor substrate 220. For example, the impurity implantation region 225 may be doped to include a different type and/or concentration of charged dopant compared to the first semiconductor substrate 220. In some example embodiments, the gate insulating layer 222, the gate electrode 223 and the gate spacer 224 may form a first gate structure GS1, the gate electrode 223 of the first gate structure GS1 may serve as a gate of the first transistor TR1, and the impurity implantation region 225 may serve as a source/drain of the first transistor TR1. The gate electrode 223 may include a conductive material such as a metal (e.g., tungsten (W)), a conductive oxide, a conductive metal nitride, and/or polysilicon (Poly-Si).

The first transistor TR1 may be exposed by a gate trench T_trl of a second semiconductor substrate 320 that will be described later. For example, the first gate structure GS1 of the first transistor TR1 may be more protruded than a front surface of the second semiconductor substrate 320 in the gate trench T_trl. Therefore, a trench (e.g., on which a lower surface of the first gate structure GS1 is formed) is formed on an entire surface of the first semiconductor substrate 220, and an uppermost surface of the first gate structure GS1 is disposed in a direction of a second insulating layer 330 that covers the second semiconductor substrate 320.

For easiness of description, a height of the first gate structure GS1 will be described in conjunction with description of a second gate structure GS2.

The pixel separation pattern 226 may be disposed in the first semiconductor substrate 220. The pixel separation pattern 226 may define a plurality of unit pixels. The unit pixels may be arranged two-dimensionally in a plan view. For example, the pixel separation pattern 226 may be formed in a lattice shape in a plan view to separate the unit pixels from each other. The pixel separation pattern 226 may be formed by filling an insulating material in a deep trench formed by patterning the first semiconductor substrate 220.

In some embodiments, the pixel separation pattern 226 may include an insulating spacer layer 227 and a conductive filling pattern 228. The insulating spacer layer 227 may be extended to be conformal along a side of the trench in the first semiconductor substrate 220. The conductive filling pattern 228 may be formed on the insulating spacer layer 227 to fill a portion of the trench in the first semiconductor substrate 220.

Additionally, referring to FIG. 10, the pixel separation pattern 226 may be formed from the rear surface of the first semiconductor substrate 220. For example, the trench may be formed on the rear surface of the first semiconductor substrate 220, the insulating spacer layer 226 is formed in the trench, and the conductive filling pattern 227 is filled on the insulating spacer layer 226, whereby the pixel separation pattern 226 may be formed. The pixel separation pattern 226 may be spaced apart from (e.g., not be in contact with) the front surface of the first semiconductor substrate 220. In this case, the pixel separation pattern 226 may be a backside deep trench isolation (BDTI).

In addition, a pixel separation pattern 226' may be formed from the front surface of the first semiconductor substrate 220. The trench may be formed on the front surface of the first semiconductor substrate 220. In this case, the trench formed from the front surface may pass through the first semiconductor substrate 220. Afterwards, an insulating spacer layer 227' is formed in the trench, and a conductive filling pattern 228' is filled on the insulating spacer layer 227', whereby a pixel separation pattern 226' may be formed. In this case, the pixel separation pattern 226' may be a frontside deep trench isolation (FDTI).

The unit pixel may include a photoelectric conversion layer 221. The photoelectric conversion layer 221 may be formed in the first semiconductor substrate 220. The photoelectric conversion layer 221 may generate charges in proportion to the amount of light incident from the outside. The photoelectric conversion layer 221 may be formed by doping impurities in the first semiconductor substrate 220. For example, when the first semiconductor substrate 220 is doped with p-type impurities, the photoelectric conversion layer 221 may be doped with n-type impurities.

The upper chip 200 may include a surface insulating layer 210, a passivation layer 240, a grid pattern 250, a first liner 253, a color filter CF, a micro lens ML, and a second liner 254.

The surface insulating layer 210 may be stacked on the rear surface of the first semiconductor substrate 220. The passivation layer 240 and a pad 241 may be stacked on the surface insulating layer 210. The pad 241 may be disposed on the first through via THV1 and/or the second through via THV2. An electrical signal may be transmitted and received through the pad 241 and the first through via THV1 and/or through the pad 241 and the second through via THV2.

The first through via THV1 may be extended from an upper surface of the first semiconductor substrate 220. The first through via THV1 may be extended to third metal layers ML3_1 to ML3_5 of the lower chip 400 in the third direction Z. The first through via THV1 may be formed by filling the trench formed in an outer region of the upper chip 200, the intermediate chip 300 and the lower chip 400 with a conductive material, and the first through via THV1 may connect the upper chip 200, the intermediate chip 300, and the lower chip 400 with one another. In addition, the first through via THV1 may allow the upper chip 200, the intermediate chip 300, and the lower chip 400 to be fixed.

The second through via THV2 may be extended from the rear surface of the first semiconductor substrate 220. The second through via THV2 may be extended to the third metal layers ML3_1 to ML3_5 of the lower chip 400 in the third direction Z. The second through via THV2 may be spaced apart from the first through via THV1. In addition, since the second through via THV2 may be connected to second metal layers ML2_1 to ML2_5 of the intermediate chip 300, the second through via THV2 may connect the second metal layers ML2_1 to ML2_5 with the third metal layers ML3_1 to ML3_5. For example, the second through via THV2 may be formed by filling the trench formed in the outer region of the upper chip 200, the intermediate chip 300, and the lower chip 400 with a conductive material, and the second through via THV2 may connect the upper chip 200, the intermediate chip 300, and the lower chip 400 with one another. Further, the second through via THV2 may allow the upper chip 200, the intermediate chip 300, and the lower chip 400 to be fixed.

The grid pattern 250, the first liner 253, the color filter CF, the micro lens ML, and the second liner 254 may be disposed in a region defined by the surface insulating layer 210.

The color filter CF may be formed on the surface insulating layer 210. The color filter CF may be arranged to correspond to each unit pixel. Each color filter CF may be arranged two-dimensionally in a plane view. The micro lens ML may be formed on the color filter CF. The micro lens ML may be arranged to correspond to each unit pixel. The micro lens ML may have a convex shape, and may have a predetermined (e.g., static) curvature radius. Therefore, the micro lens ML may condense the light incident on the photoelectric conversion layer 221. The micro lens ML may include, for example, a light-transmissive resin, but is not limited thereto.

The grid pattern 250 may be formed between the color filters CF. The grid pattern 250 may be formed on the surface insulating layer 210. The grid pattern 250 may include, for example, a metal pattern 251 and a low refractive index pattern 252. The metal pattern 251 and the low refractive index pattern 252 may sequentially be stacked on the surface insulating layer 210.

The first liner 253 may be formed on the surface insulating layer 210 and the grid pattern 250. The first liner 253 may be extended along surfaces of the surface insulating layer 210 and the grid pattern 250. The first liner 253 may include, for example, an inorganic oxide layer (e.g., aluminum oxide), but is not limited thereto.

The second liner 254 may be extended along a surface of the micro lens ML. The second liner 254 may include, for example, an inorganic oxide layer (e.g., silicon oxide, titanium oxide, zirconium oxide, hafnium oxide, and/or a combination thereof) but is not limited thereto.

The upper chip 200 may include a first insulating layer 230. The first insulating layer 230 may be disposed between the first semiconductor substrate 220 and the second semiconductor substrate 320 in contact with the first semiconductor substrate 220 and the second semiconductor substrate 320, and its thickness W230 may range from 30 nm to 45 nm.

The first insulating layer 230 may include at least one of, for example, silicon oxide, silicon nitride, silicon oxynitride, a low dielectric constant material (e.g., a material having a dielectric constant lower than that of silicon oxide), and/or a combination thereof. The low dielectric constant material may include, for example, Flowable Oxide (FOX), Tonen SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, and/or a combination thereof, but is not limited thereto.

The first insulating layer 230 may not include a metal line extended in the first direction X (or the second direction Y) in parallel between the first semiconductor substrate 220 and the second semiconductor substrate 320 and may include a portion of a (2_1)th contact C2_11 extended in the third direction Z through the gate trench T_trl of the second semiconductor substrate 320.

The intermediate chip 300 may be disposed below the upper chip 200. For example, a rear surface 300B of the intermediate chip 300 and a front surface 200A of the upper chip 200 may be in contact with each other, and thus the first insulating layer 230 may be disposed between the first semiconductor substrate 220 and the second semiconductor substrate 320 in contact with the first semiconductor substrate 220 and the second semiconductor substrate 320.

Referring to FIGS. 7 and 9, the intermediate chip 300 may include a second semiconductor substrate 320, a second transistor TR2, a second insulating layer 330, and a connection structure. The connection structure may be formed in the second insulating layer 330. The connection structure may include a plurality of second metal layers ML2_1 to ML2_5, a first bonding pad BP1, a first dummy pad DP1, and a plurality of second contacts C2_1, C2_2 to C2_5, C2_6.

The second semiconductor substrate 320 may be (and/or include), for example, an elemental and/or a compound semiconductor. For example, the second semiconductor substrate 320 may be (and/or include) a bulk silicon, silicon-on-insulator (SOI), silicon germanium, indium antimonide, lead telluride, indium arsenic, indium phosphide, gallium arsenide, gallium antimonide, and/or the like. A thickness W320 of the second semiconductor substrate 320 in the third direction Z may be in the range of 5 nm to 10 nm.

The second semiconductor substrate 320 is bonded to the first semiconductor substrate 220 after forming one stacked structure together with the first insulating layer 230. A thickness W_ss of the bonded stacked structure is in the range of 40 nm to 50 nm in the third direction Z.

Also, the second semiconductor substrate 320 includes a gate trench T_trl that exposes the first transistor TR1 of the first semiconductor substrate 220 with respect to the second insulating layer 330. The gate trench T_trl may pass through the front and rear surfaces of the second semiconductor substrate 320, and the first gate structure GS1 of the first transistor TR1 may be more protruded than the front surface of the second semiconductor substrate 320 through the gate trench T_trl.

The second transistor TR2 may be disposed on the front surface of the semiconductor substrate 320. The second transistor TR2 may be implemented and operated as various transistors (e.g., transmission transistor, reset transistor, source follower transistor, and selection transistor) constituting a unit pixel of an image sensor. The second transistor TR2 may include a gate insulating layer 322, a gate electrode 323, a gate spacer 324, and an impurity implantation region 325.

The gate electrode 323 may fill a region defined by the gate insulating layer 322 and the gate spacer 324. The impurity implantation region 325 may be formed by doping impurities in the second semiconductor substrate 320. The gate insulating layer 322, the gate electrode 323, the gate spacer 324 may form the second gate structure GS2, the gate electrode 323 of the second gate structure GS2 may serve as a gate of the second transistor TR2, and the impurity implantation region 324 may serve as a source/drain of the second transistor TR2. The gate electrode 323 may include a conductive material such as a metal (e.g., tungsten (W)), a conductive oxide, a conductive metal nitride, and/or polysilicon (Poly-Si).

An uppermost surface of the second gate structure GS2 may be disposed in the direction of the second insulating layer 330 that covers the second semiconductor substrate 320.

A height H2 of the uppermost surface of the second gate structure GS2 based on the front surface of the second semiconductor substrate 320 may be higher than a height H1 of the uppermost surface of the first gate structure GS1 based on the front surface of the second semiconductor substrate 320. Therefore, the uppermost surface of the first gate structure GS1 may be disposed between the front surface of the second semiconductor substrate 320 and the uppermost surface of the second gate structure GS2. However, the second gate structure GS2 and the first gate structure GS1 may be disposed to be aligned with each other in structural characteristics except the heights of the uppermost surfaces.

The second insulating layer 330 may be formed on the front surface of the second semiconductor substrate 320 to cover the first and second transistors TR1 and TR2.

The second insulating layer 330 may include at least one of, for example, silicon oxide, silicon nitride, silicon oxynitride, a low dielectric constant material, and/or a combination thereof. The low dielectric constant material may include, for example, Flowable Oxide (FOX), Tonen SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, and/or a combination thereof, but is not limited thereto.

The second metal layers ML2_1 to ML2_5 may be formed in the second insulating layer 330, and may be extended in the first direction X or the second direction Y. The second metal layers ML2_1 to ML2_5 may sequentially be disposed from the front surface of the second semiconductor substrate 320 where the second transistor TR2 is positioned. For example, the (2_1)th metal layer ML2_1 may be most adjacent to the first transistor TR1 and the second transistor TR2, and the (2_5)th metal layer ML2_5 may be disposed to be farthest away from the first transistor TR1 and the second transistor TR2. The (2_2)th to (2_4)th metal layers ML2_2 to ML2_4 may be disposed between the (2_1)th metal layer ML2_1 and the (2_5)th metal layer ML2_5. Thicknesses of the second metal layers ML2_1 to ML2_5 may be the same as one another, but the embodiments according to the technical spirits of the present disclosure are not limited thereto. Also, although the number of the second metal layers ML2_1 to ML2_5 is shown as 5, this is only an example, and the number and arrangement of the second metal layers ML2_1 to ML2_5 may be modified in various ways.

The second metal layers ML2_1 to ML2_5 may be connected by a plurality of second contacts C2_1 to C2_5. In particular, the (2_1)th contact C2_1 may include a (2_11)th contact C2_11 and a (2_12)th contact C2_12. For example, the second metal layer ML2_1 may be connected to the gate electrode 223 and the impurity implantation region 225 of the first transistor TR1 by a gate contact extended in the third direction Z through the gate trench T_trl and the (2_11)th contact C2_11 that is a source/drain contact, and the second metal layer ML2_1 may be connected to the gate electrode 323 and the impurity implantation region 325 of the second transistor TR2 by the gate contact extended in the third direction Z and the (2_12)th contact C2_12 that is a source/drain contact.

In addition, the first bonding pad BP1 is electrically connected with the second metal layers ML2_1 to ML2_5 through the (2_6)th contact C2_6 that is farthest away therefrom, and the first dummy pad DP1 is not in contact with a separate contact. The second metal layers ML2_1 to ML2_5 may be in contact with and electrically connected to the second through via THV2 that passes through the first and second semiconductor substrates 220 and 320 and a portion of the first and second insulating layers 230 and 330.

The first bonding pad BP1 and the first dummy pad DP1 may be disposed on a front surface 300A of the intermediate chip 300 and thus their one surfaces may be exposed on the third insulating layer 330. The intermediate chip 300 and the lower chip 400 may be connected with the first bonding pad BP1 and the first dummy pad DP1 on a third insulating layer 430, which will be described later, by the second bonding pad BP2 and the second dummy pad DP2, of which one surfaces are exposed.

Additionally, referring to FIG. 11, the first bonding pad BP1 and the second bonding pad BP2 may be in contact with each other on the first bonding surface BS1 in a misaligned state. For example, a portion of the first bonding pad BP1 may be in contact with the second bonding pad BP2, but another portion of the first bonding pad BP1 may be in contact with the third insulating layer 430. Also, for example, a portion of the second bonding pad BP2 may be in contact with the first bonding pad BP1, but another portion of the second bonding pad BP2 may be in contact with the second insulating layer 330.

A first cavity CV1 may be formed between the first bonding pad BP1 and the second insulating layer 330. For example, the first cavity CV1 may mean an empty space surrounded by the first bonding pad BP1, the second insulating layer 330, and the third insulating layer 430. In addition, the empty space surrounded by the second bonding pad BP2, the second insulating layer 330, and the third insulating layer 430 may be a second cavity CV2. However, the embodiments are not limited to this example, and the first and second cavities CV1 and CV2 may not be formed.

Referring to FIG. 12, before the intermediate chip 300 and the lower chip 400 are bonded to each other, the intermediate chip 300 may include a first cavity CV1 and a first cavity CV1', and the lower chip 400 may include a second cavity CV2 and a second cavity CV2'. As the intermediate chip 300 and the lower chip 400 are bonded to each other, diffusion of the metal material may occur, whereby the first and second cavities CV1' and CV2' may be removed. However, the first cavity CV1 and the second cavity CV2 do not cause diffusion of the metal material, and thus may be maintained.

Referring back to FIG. 5, the first bonding pad BP1, the second bonding pad BP2, the first dummy pad DP1, and the second dummy pad DP2 may be disposed in the image sensor 100 regardless of positions. For example, the first and second through vias THV1 and THV2 of FIG. 5 are disposed in a region where the pixel array PA of the image sensor 100 is not disposed, whereas the first bonding pad BP1, the second bonding pad BP2, the first dummy pad DP1, and the second dummy pad DP2 may be formed in the region in which the pixel array PA is disposed.

The second metal layers ML2_1 to ML2_5 of each level may be connected with the first bonding pad BP1 by a plurality of second contacts C2_1, C2_2 to C2_5, C2_6 of each level. Therefore, the electrical signal transferred from the photoelectric conversion layer 221 may be transferred through the first transistor TR1, the second transistor TR2, the second metal layers ML2_1 to ML2_5, the plurality of second contacts C2_1, C2_2 to C2_5, C2_6, and the first bonding pads BP1.

The second metal layers ML2_1 to ML2_5 and the plurality of second contacts C2_1, C2_2 to C2_5, and C2_6 may include a conductive material. For example, the second metal layers ML2_1 to ML2_5, the plurality of second contacts C2_1, C2_2 to C2_5, C2_6, the first bonding pad BP1 and the first dummy pads DP1 may include metal materials such as copper, lead, etc.

The lower chip 400 may be disposed below the intermediate chip 300. That is, a front surface 400A of the lower chip 400 and the front surface 300A of the intermediate chip 300 may be in contact with a first bonding surface BS1.

The lower chip 400 may include a third semiconductor substrate 420, a third transistor TR3, a third insulating layer 430, a plurality of third metal layers ML3_1 to ML3_5, and a plurality of third contacts C3_1, C2_2 to C3_5, C3_6.

The third semiconductor substrate 420 may be (and/or include), for example, an elemental and/or a compound semiconductor. For example, the second semiconductor substrate 320 may be (and/or include) a bulk silicon, silicon-on-insulator (SOI), silicon germanium, indium antimonide, lead telluride, indium arsenic, indium phosphide, gallium arsenide, gallium antimonide, and/or the like.

The third transistor TR3 may be disposed on a front surface of the third semiconductor substrate 420. For example, the third transistor TR3 may be implemented and operated by a logic element, such as a control register block 1110, a timing generator 1120, a row driver 1130, a read out circuit 1150 and a ramp signal generator 1160 of the image sensor 100, or memory cells. The third transistor TR3 may include a gate insulating layer 422, a gate electrode 423, a gate spacer 424, and an impurity implantation region 425. The gate electrode 423 may include a conductive material such as a metal (e.g., tungsten (W)), a conductive oxide, a conductive metal nitride, and/or polysilicon (Poly-Si).

The third insulating layer 430 may include at least one of, for example, silicon oxide, silicon nitride, silicon oxynitride, a low dielectric constant material, and/or a combination thereof. The low dielectric constant material may include, for example, Flowable Oxide (FOX), Tonen SilaZene (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, or their combination, but is not limited thereto.

The third metal layers ML3_1 to ML3_5 may be formed in the third insulating layer 430. The third metal layers ML3_1 to ML3_5 may sequentially be disposed from the front surface of the third semiconductor substrate 420 where the third transistor TR3 is positioned. For example, the (3_1)th metal layer ML3_1 may be most adjacent to the third transistor TR3, and the (3_5)th metal layer ML3_5 may be disposed to be farthest away from the third transistor TR3. The (3_2)th to (3_4)th metal layers ML3_2 to ML3_4 may be disposed between the (3_1)th metal layer ML3_1 and the (3_5)th metal layer ML3_5. Thicknesses of the third metal layers ML3_1 to ML3_5 may be the same as one another, but the embodiments according to the technical spirits of the present disclosure are not limited thereto. Also, although the number of the third metal layers ML3_1 to ML3_5 is shown as 5, this is only an example, and the number and/or arrangement of the third metal layers ML3_1 to ML3_5 may be modified in various ways.

The third metal layers ML3_1 to ML3_5 may be connected by a plurality of third contacts C3_1 to C3_5. For example, the third metal layers ML3_1 to ML3_5 may be connected to the gate electrode 423 and the impurity implantation region 425 of the third transistor TR3 by the gate contact and the (3_1)th contact C3_1 that is a source/drain contact. In addition, the second bonding pad BP2 may be electrically connected to the third metal layers ML3_1 to ML3_5 through the (3_6)th contact C3_6, which is farthest away therefrom, and the second dummy pad DP2 is not in contact with a separate contact. Further, the second bonding pad BP2 and the second dummy pad DP2 are disposed on the front surface 400A of the lower chip 400 and thus their one surfaces are exposed on the third insulating layer 430. The intermediate chip 300 and the lower chip 400 may be electrically connected to each other as an electrical signal is connected thereto through the first bonding pad BP1 and the second bonding pad BP2.

The plurality of third metal layers ML3_1 to ML3_5 and the plurality of third contacts C3_1, C3_2 to C3_5 and C3_6 may include a conductive material. For example, the plurality of third metal layers ML3_1 to ML3_5 and the plurality of third contacts C3_1, C3_2 to C3_5 and C3_6 may include metal materials such as copper, lead, etc.

Figure 13:
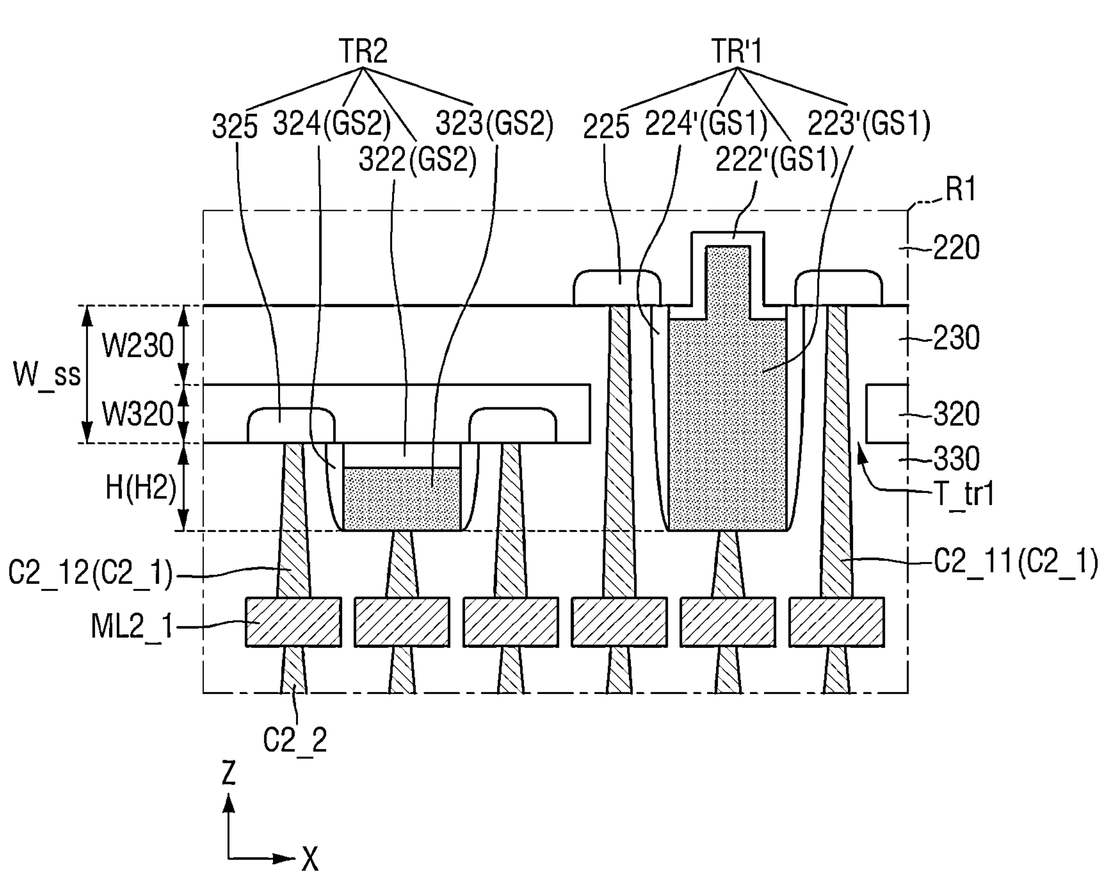
FIG. 13 is a view illustrating an image sensor according to some embodiments of the present disclosure.

FIG. 13 is a view illustrating an image sensor according to some example embodiments. For convenience of description, the description of FIG. 13 will be based on a difference from the description of FIG. 9.

A height H of the uppermost surface of the first gate structure GS1 based on the front surface of the second semiconductor substrate 320 may be the same as a height H (H2 of FIG. 9) of the uppermost surface of the second gate structure GS2 based on the front surface of the second semiconductor substrate 320. Therefore, the uppermost surface of the first gate structure GS1 may be disposed at the same height as that of the uppermost surface of the second gate structure GS2 based on the front surface of the second semiconductor substrate 320.

FIGS. 14 to 23 are views illustrating intermediate steps to describe a method of manufacturing an image sensor according to some embodiments of the present disclosure. FIGS. 14 to 23 are views illustrating a manufacturing process of the first transistor TR1 and the second transistor TR2, which are disposed in the upper chip 200 and the intermediate chip 300.

Figure 14:
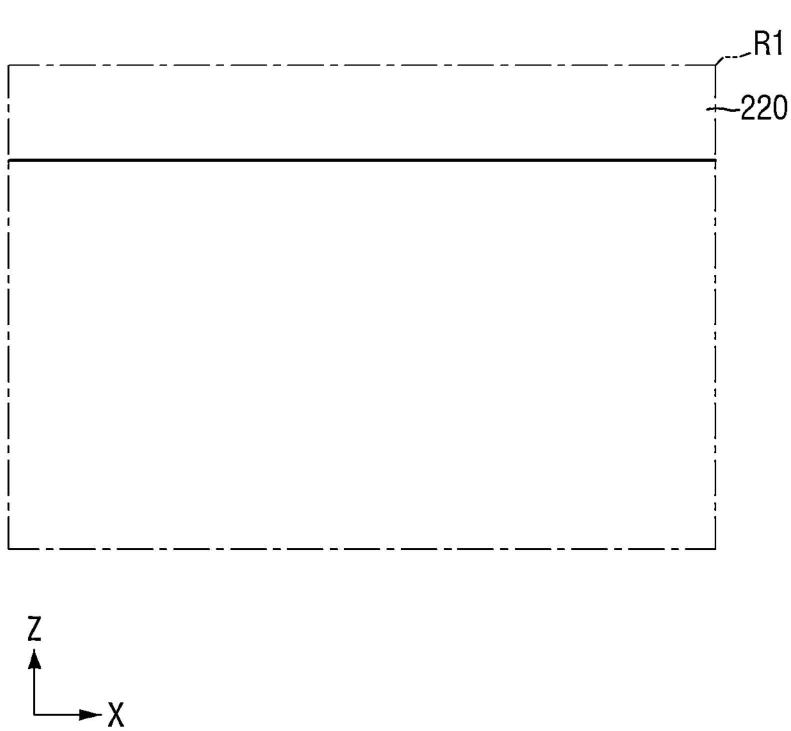
FIGS. 14 to 23 are views illustrating intermediate steps to describe a method of manufacturing an image sensor according to some embodiments of the present disclosure.
Figure 15:
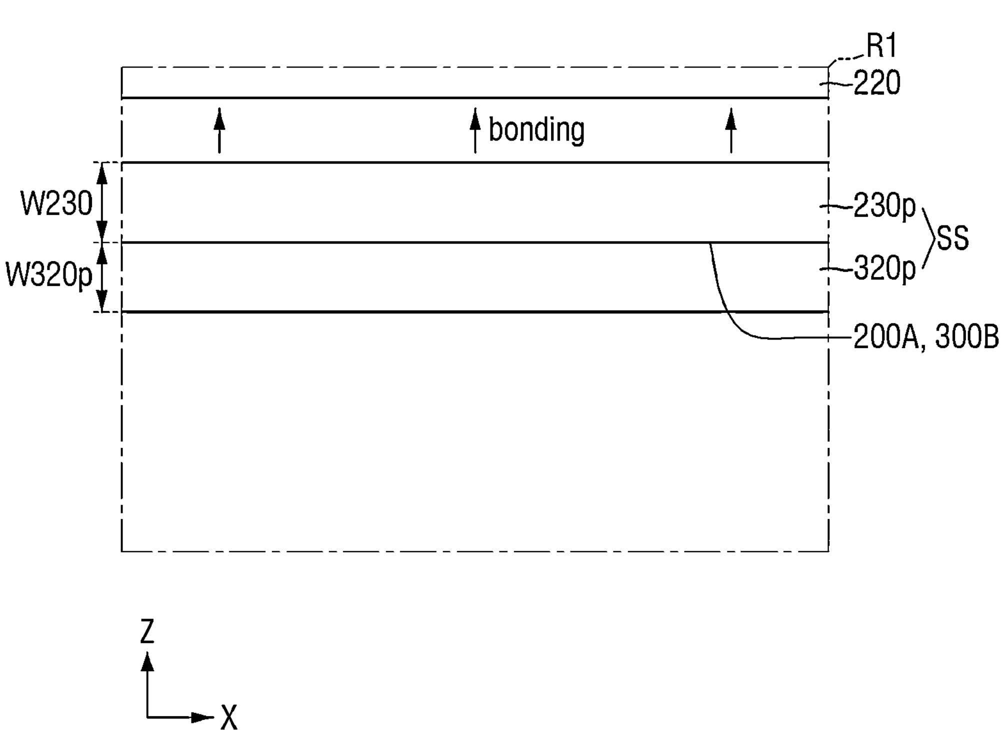
Figure 16:
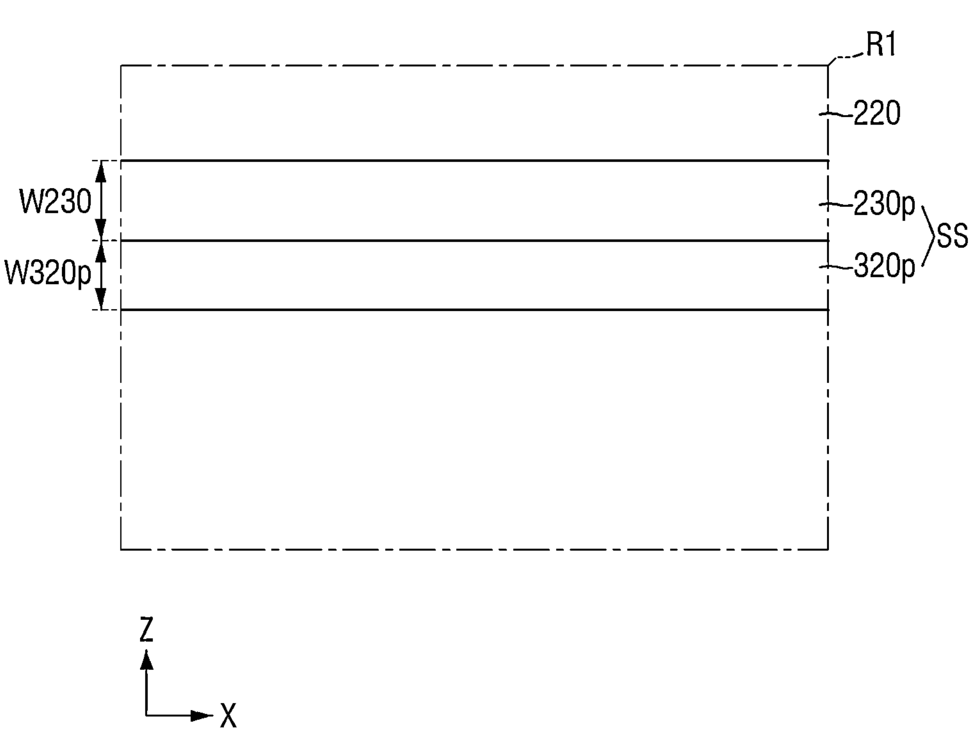

Referring to FIGS. 14 to 16, a stacked structure SS is bonded onto the front surface of the first semiconductor substrate 220.

Although not shown, the first semiconductor substrate 220 may include the pixel separation pattern 226 of FIG. 7, and thus may be divided into a plurality of unit pixels by the pixel separation pattern 226.

The stacked structure SS includes a first pre-insulating layer 230*p* and a second pre-semiconductor substrate 320*p*, and the first pre-insulating layer 230*p* and the second pre-semiconductor substrate 320*p* respectively correspond to the first insulating layer 230 and the second semiconductor substrate 320 of FIG. 9, and a surface between the first insulating layer 230 and the second semiconductor substrate 320 corresponds to the front surface 200A of the upper chip 200 and the rear surface 300B of the intermediate chip 300 in FIG. 6.

Therefore, a description of the materials will be omitted as the description of a material of each of the first pre-insulating layer 230*p* and the second pre-semiconductor substrate 320*p* may be replaced with the above description of the first insulating layer 230 and the second semiconductor substrate 320.

However, a thickness W320*p* of the second pre-semiconductor substrate 320*p* in the third direction Z may be thicker than a thickness W320 of the second semiconductor substrate 320. The thickness W320*p* of the second pre-semiconductor substrate 320*p* is in the range of 25 nm to 700 nm, and an etching and planarization process may be performed after bonding of the stacked structure SS.

Figure 17:
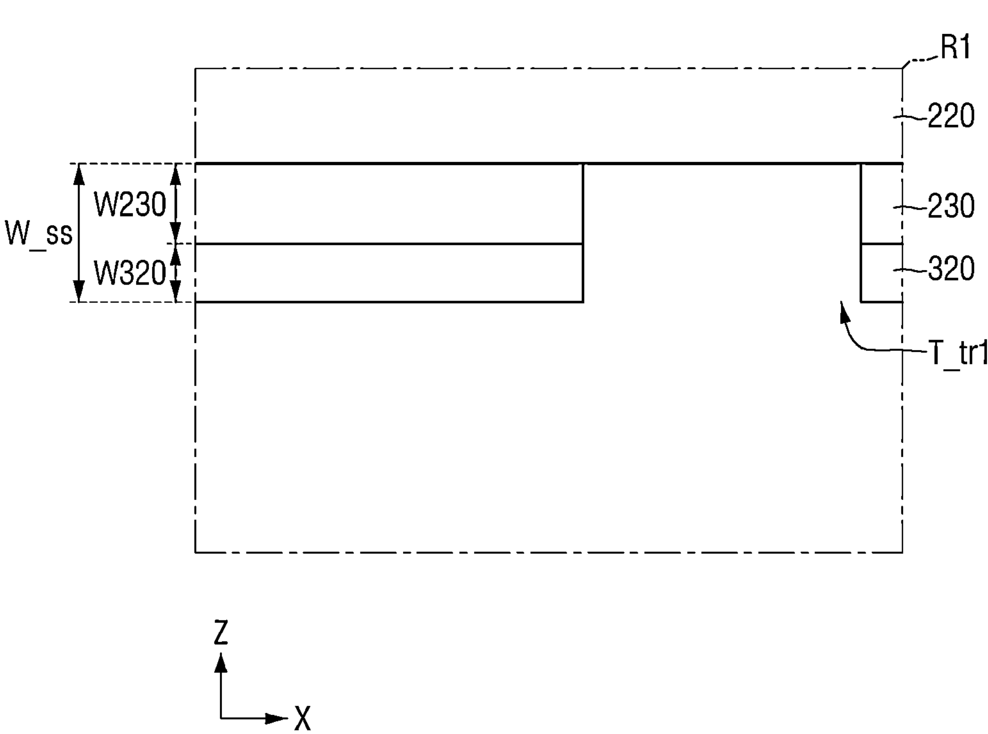

Referring to FIG. 17, at least a portion of the first insulating layer 230 and the second semiconductor substrate 320 is etched to form a gate trench T_trl that exposes a portion of the first semiconductor substrate 220.

In some example embodiments, the gate trench T_trl may be formed by a one-step etching process performed in one process.

Figure 18:
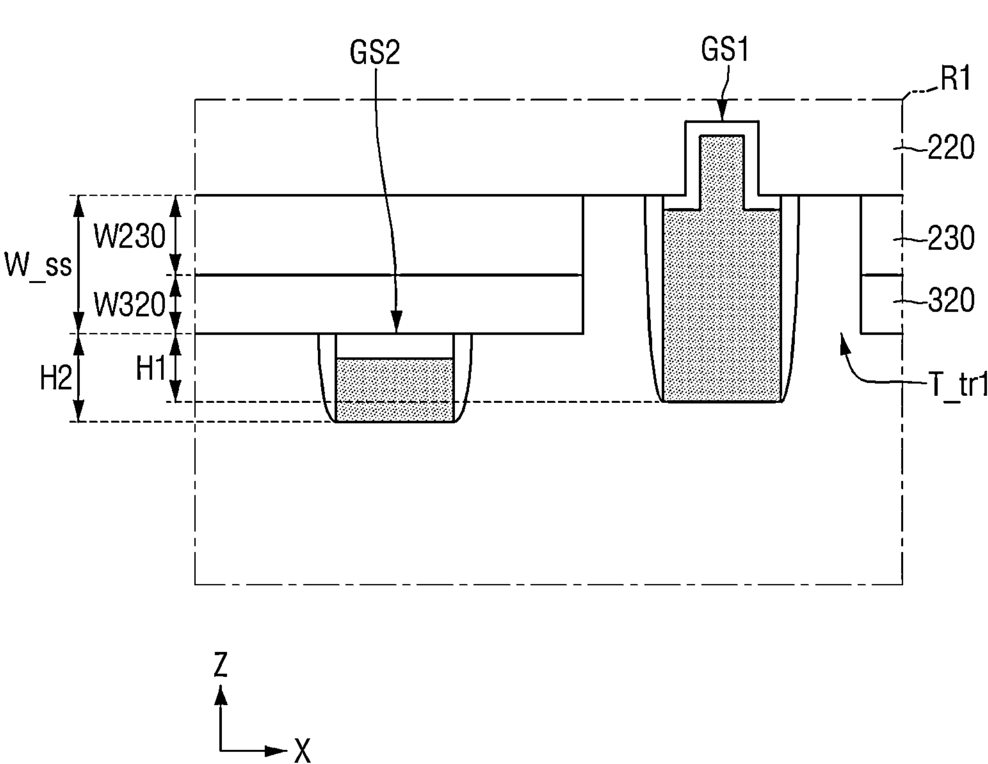

Referring to FIG. 18, a first gate structure GS1 is formed on the front surface of the first semiconductor substrate 220 through the gate trench T_trl, and a second gate structure GS2 is formed on the front surface of the second semiconductor substrate 320.

Although not shown, a trench may be formed on the front surface of the first semiconductor substrate 220 to form the first gate structure GS1, and the first semiconductor substrate 220 may be doped with impurities through the trench to form a photoelectric conversion layer 221. After the photoelectric conversion layer 221 is formed, the first gate structure GS1 and the second gate structure GS2 may be formed together. The gate electrodes 223 and 323 of the first gate structure GS1 and the second gate structure GS2 may be formed by a one-step process performed in one process.

Figure 19:
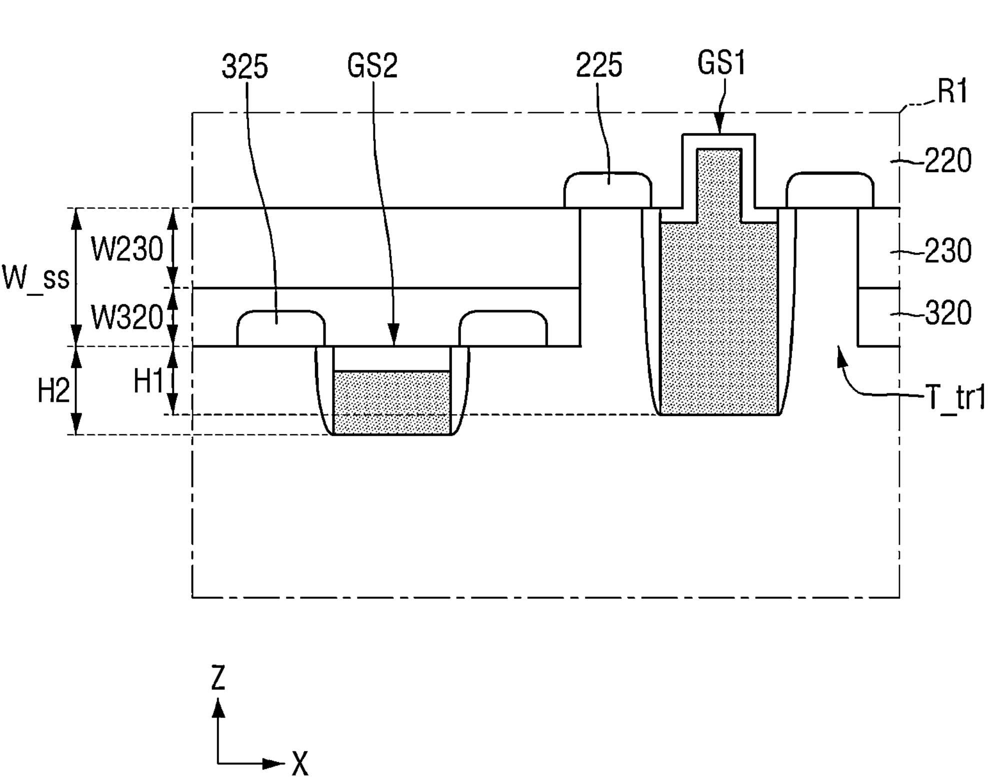

Referring to FIG. 19, impurities are implanted into a region adjacent to the first gate structure GS1 and the second gate structure GS2 to form impurity implantation regions 325 and 425 on the first semiconductor substrate 220 and the second semiconductor substrate 320.

Figure 20:
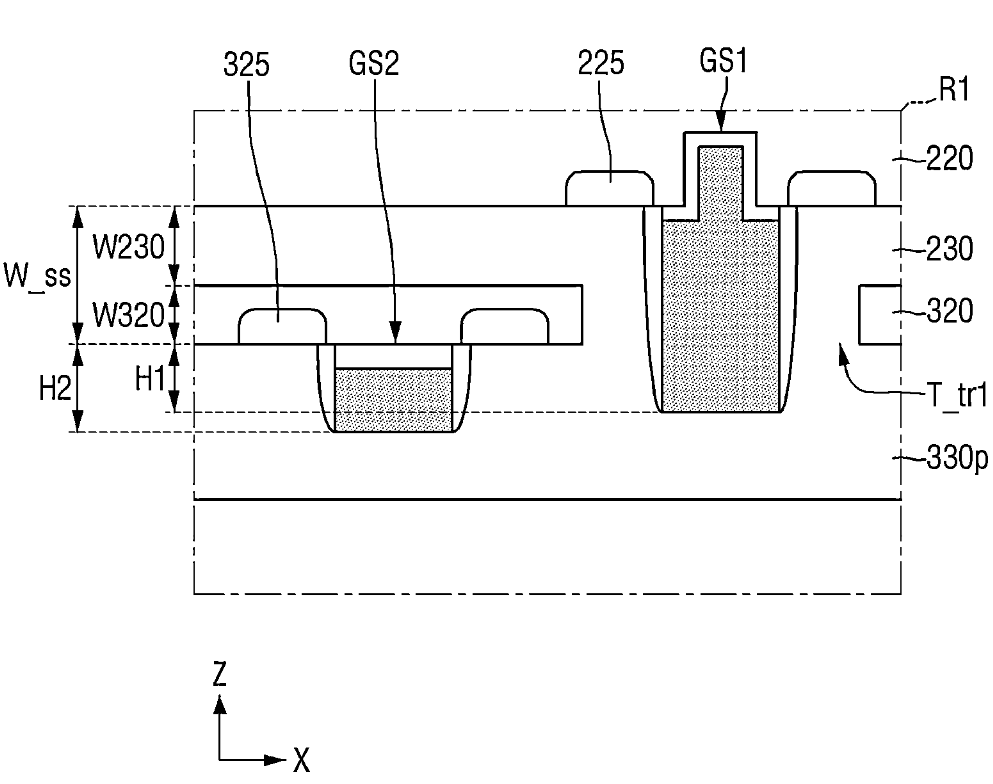

Referring to FIG. 20, a second pre-insulating layer 330*p* covering the first transistor TR1 including the first gate structure GS1 and the second transistor TR2 including the second gate structure GS2 is formed on the second semiconductor substrate 320.

The second pre-insulating layer 330*p* corresponds to the second insulating layer 330 of FIG. 9 and may include the same material as that of the first insulating layer 230 and the second insulating layer 330. Therefore, a repeat of the description of the material of the second pre-insulating layer 330*p* is omitted.

Figure 21:
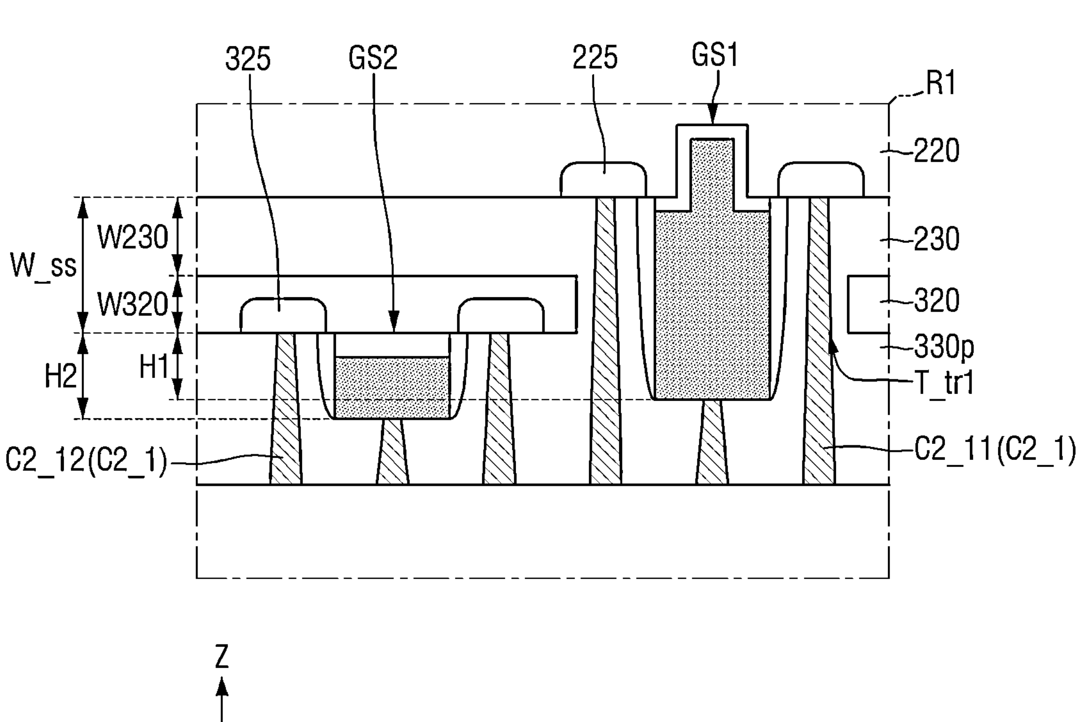

Referring to FIG. 21, a (2_1)th contact C2_1 passing through the second pre-insulating layer 330*p* in the third direction Z, connected with the gate structures GS1 and GS2 and the impurity implantation regions 225 and 325 may be formed. A (2_11)th contact C2_11 and a (2_12)th contact C2_12 of the (2_1)th contact C2_1 connected with the first transistor TR1 and the second transistor TR2 are formed together.

Figure 22:
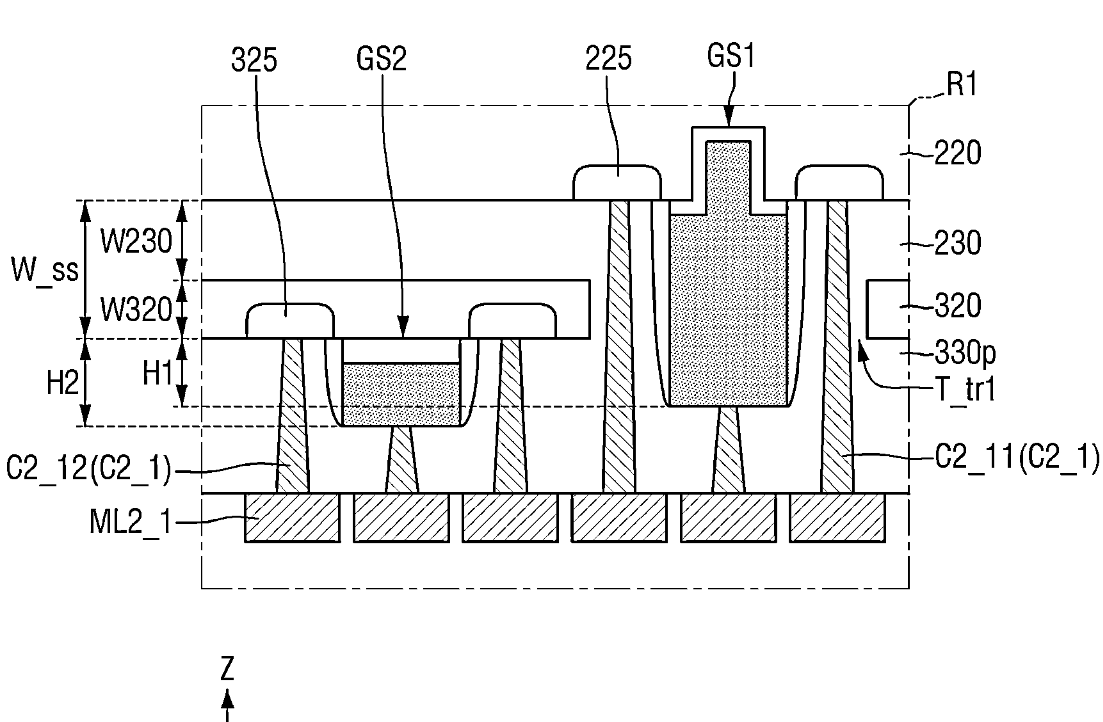
Figure 23:
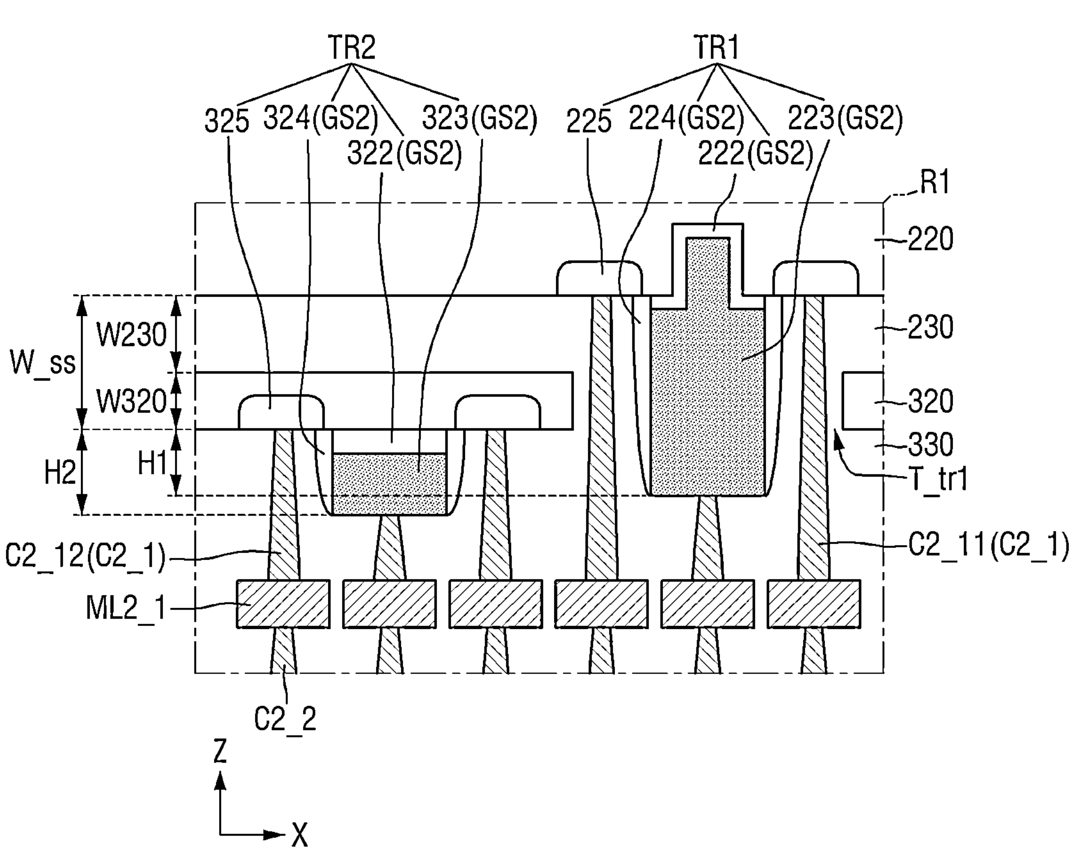

Referring to FIGS. 22 and 23, a (2_1) metal layer ML2_1, which is in contact with the (2_1)th contact C2_1, is formed on the second pre-insulating layer 330*p*. The (2_1)th metal layer ML2_1 may be a metal line disposed to be most adjacent to the first transistor TR1 and the second transistor TR2 in the second insulating layer 330.

The structure and arrangement relationship of the transistors TR1 and TR2 in FIGS. 9 and 13 may be formed through the manufacturing process of FIGS. 14 to 23, and elements of the upper chip 200 and the intermediate chip 300 may simultaneously be formed in the image sensor 100 of the present disclosure through the manufacturing process of FIGS. 14 to 23, and manufacturing costs and time of the image sensor 100 having the stacked structure may be reduced by the manufacturing process of FIGS. 14 to 23. Further, the manufacturing process of the image sensor may be simplified, and the size of the product may be reduced.

Figure 24:
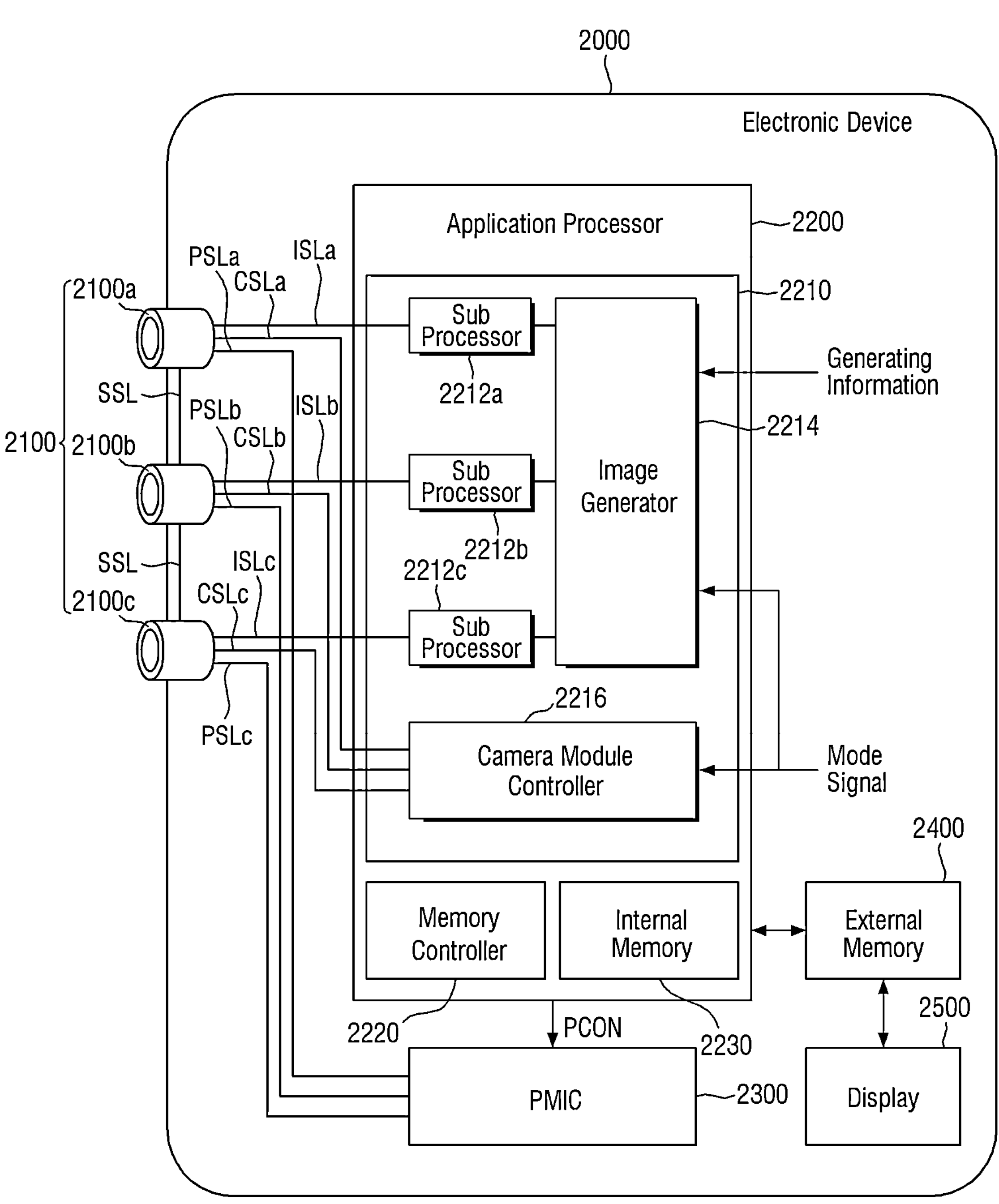
FIG. 24 is a block view illustrating an electronic device including a multi-camera module according to some embodiments of the present disclosure.
Figure 25:
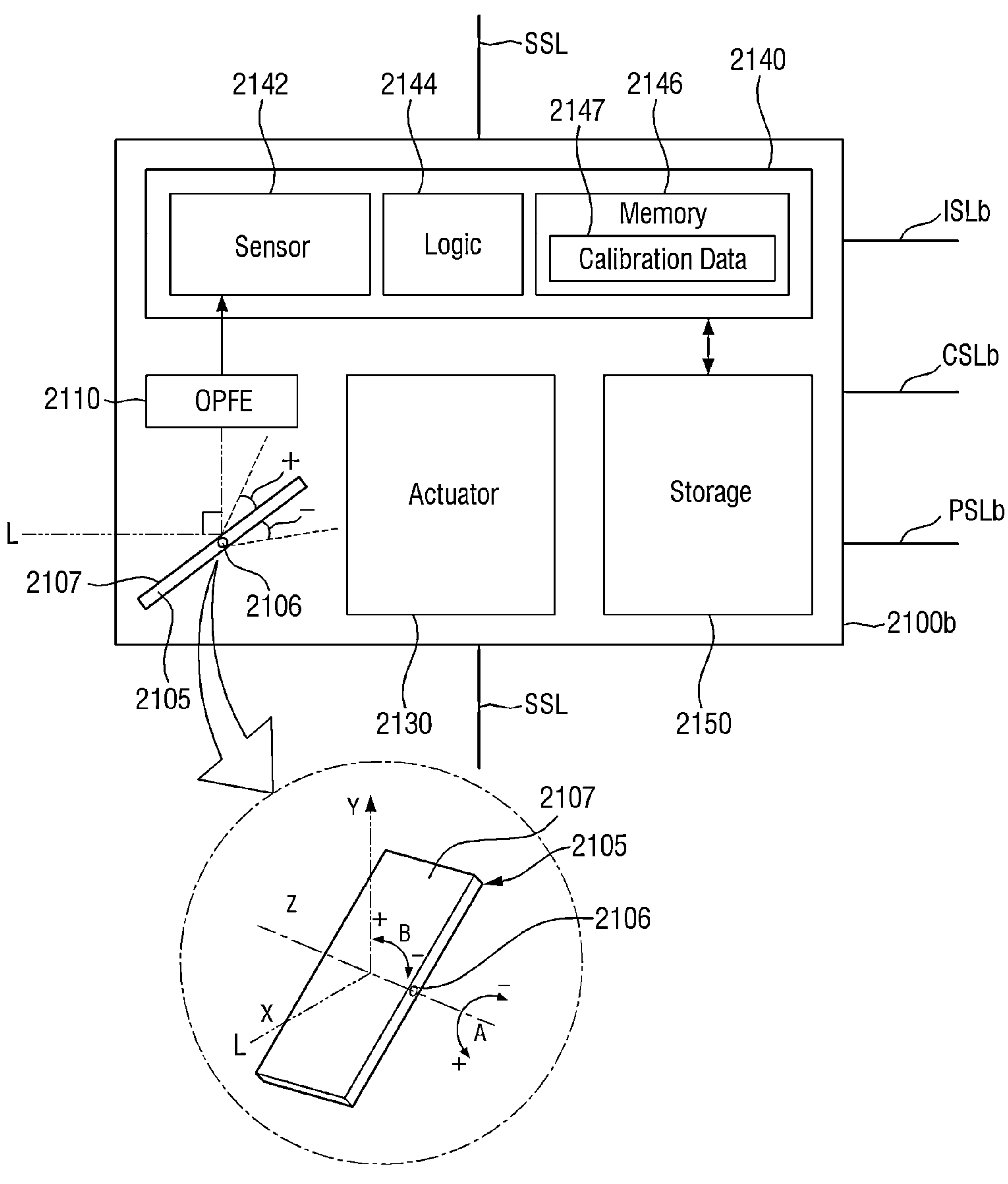
FIG. 25 is a detailed block view of the camera module of FIG. 24.

FIG. 24 is a block view illustrating an electronic device that includes a multi-camera module according to some embodiments, and FIG. 25 is a detailed block view of the camera module of FIG. 24.

For convenience of description, a portion repeated with the description of FIGS. 1 to 23 will be described briefly or omitted.

Referring to FIG. 24, the electronic device 2000 may include a camera module group 2100, an application processor 2200, a power management integrated circuit (PMIC) 2300, an external memory 2400, and a display 2500.

The camera module group 2100 may include a plurality of camera modules 2100*a*, 2100*b* and 2100*c*. Although the drawing shows an embodiment in which three camera modules 2100*a*, 2100*b* and 2100*c* are disposed, the embodiments are not limited to this example. In some embodiments, the camera module group 2100 may be carried out by being modified to include only two camera modules. Also, in some embodiments, the camera module group 2100 may be carried output by being modified to include n number of camera modules (n is a natural number of 4 or more).

In this case, one of the three camera modules 2100*a*, 2100*b* and 2100*c* may be a camera module that includes the image sensor 100 described with reference to FIGS. 1 to 23.

Hereinafter, a detailed configuration of the camera module 2100*b* will be described with reference to FIG. 25, but the following description may equally be applied to the other camera modules 2100*a* and 2100*c* in accordance with the embodiment.

Referring to FIG. 25, the camera module 2100*b* may include a prism 2105, an Optical Path Folding Element (OPFE) 2110, an actuator 2130, an image sensing device 2140, and a storage 2150.

The prism 2105 may include a reflective surface 2107 of a light-reflective material to deform a path of externally incident light L.

In some embodiments, the prism 2105 may change a path of the incident light L in the first direction X to the second direction Y vertical to the first direction X. Also, the prism 2105 may rotate the reflective surface 2107 of the light-reflective material in a direction A based on a central axis 2106 or change the path of the incident light L in the first direction X to the second direction Y by rotating the central axis 2106 in a direction B. At this time, the OPFE 2110 may also move to the third direction Z vertical to the first direction X and the second direction Y.

In some embodiments, as shown, a maximum rotation angle of the prism 2105 in a direction of plus (+) A may be 15 degrees or less, and a maximum rotation angle of the prism 2105 in a direction of minus (−) A may be greater than 15 degrees, but the embodiments are not limited thereto.

In some embodiments, the prism 2105 may move at 20 degrees or so, between 10 degrees and 20 degrees, or between 15 degrees and 20 degrees in a direction of plus (+) or minus (−) B. In some embodiments, the moving angle may be equal in the direction of plus (+) or minus (−) B or may be almost similar in the range of 1 degree or so.

In some embodiments, the prism 2105 may move the reflective surface 2107 of the light-reflective material to the third direction (for example, direction Z) parallel with an extension direction of the central axis 2106.

The OPFE 2110 may include an optical lens comprised of, for example, m number of groups (m is a natural number). The m number of lenses may move in the second direction Y and change an optical zoom ratio of the camera module 2100*b*. For example, assuming that a basic optical zoom ratio of the camera module 2100*b* is Z, when m number of optical lenses included in the OPFE 2110 move, the optical zoom ratio of the camera module 2100*b* may be changed to an optical zoom ratio of 3Z or 5Z or more.

The actuator 2130 may move the reflective surface 2107, OPFE 2110, and/or the optical lens to a specific position. For example, the actuator 2130 may adjust a position of the optical lens such that an image sensor 2142 may be positioned at a focal length of the optical lens for exact sensing.

The image sensing device 2140 may include the image sensor 2142, a control logic 2144 and a memory 2146. The image sensor 2142 may sense an image of a sensing target by using light L provided through the optical lens. In some embodiments, the image sensor 2142 may include the aforementioned image sensor 100.

The control logic 2144 may control an overall operation of the camera module 2100*b*. For example, the control logic 2144 may control the operation of the camera module 2100*b* in accordance with a control signal provided through a control signal line CSLb.

The memory 2146 may store information, which is required for the operation of the camera module 2100*b*, such as calibration data 2147. The calibration data 2147 may include information required for the camera module 2100*b* to generate image data by using light L provided from the outside. The calibration data 2147 may include, for example, information on the aforementioned degree of rotation, information on a focal length, and information on an optical axis. When the camera module 2100*b* is implemented in the form of a multi-state camera of which focal length is varied depending on the position of the optical lens, the calibration data 2147 may include a focal length value per position (or per state) of the optical lens and information related to auto focusing. In these cases, the memory 2146 may include a variable resistor element VR1. For example, the memory 2146 may include a memory cell that includes a variable resistor element.

The storage 2150 may store the image data sensed through the image sensor 2142. The storage 2150 may be disposed outside the image sensing device 2140 and may be implemented to be stacked together with a sensor chip constituting the image sensing device 2140. In some embodiments, the storage 2150 may be implemented as an Electrically Erasable Programmable Read-Only Memory (EEPROM), but the embodiments are not limited thereto. The storage 2150 may be implemented by the lower chip 300. The storage 2150 may include a memory cell MC that includes the aforementioned variable resistor element VR1.

Referring to FIGS. 24 and 25 together, in some embodiments, each of the plurality of camera modules 2100*a*, 2100*b*, and 2100*c* may include an actuator 2130. Therefore, each of the plurality of camera modules 2100*a*, 2100*b*, and 2100*c* may include calibration data 2147 equal to or different from one another based on the operation of the actuator 2130 included therein.

In some embodiments, one (for example, 2100*b*) of the plurality of camera modules 2100*a*, 2100*b*, and 2100*c* may be a folded lens type camera module that includes the aforementioned prism 2105 and OPFE 2110, and the other camera modules (for example, 2100*a* and 2100*c*) may be vertical type camera modules that do not include the prism 2105 and the OPFE 2110, but the embodiments are not limited thereto.

In some embodiments, one (for example, 2100*c*) of the plurality of camera modules 2100*a*, 2100*b* and 2100*c* may be a vertical type depth camera that extracts depth information by using, for example, infrared ray (IR). In this case, the application processor 2200 may generate a 3D depth image by merging image data provided from the depth camera with image data provided from the other camera module (for example, 2100*a* or 2100*b*).

In some embodiments, at least two (for example, 2100*a* and 2100*c*) of the plurality of camera modules 2100*a*, 2100*b* and 2100*c* may have their respective field of views (viewing angles) different from each other. In this case, at least two (for example, 2100*a* and 2100*c*) of the plurality of camera modules 2100*a*, 2100*b* and 2100*c* have their respective optical lenses different from each other but are not limited thereto.

Also, in some embodiments, the viewing angles of the plurality of camera modules 2100*a*, 2100*b*, and 2100*c* may be different from one another. In this case, the optical lenses respectively included in the plurality of camera modules 2100*a*, 2100*b*, and 2100*c* may be different from one another, but are not limited thereto.

In some embodiments, the plurality of camera modules 2100*a*, 2100*b*, and 2100*c* may be disposed to be physically spaced apart from one another. That is, one image sensor 2142 is not used by the plurality of camera modules 2100*a*, 2100*b*, and 2100*c* commonly by dividing a sensing region of the image sensor 2142, but the image sensor 2142 may independently be disposed in each of the plurality of camera modules 2100*a*, 2100*b*, and 2100*c*.

Referring to FIG. 24 again, the application processor 2200 may include an image processing device 2210, a memory controller 2220, and an internal memory 2230. The application processor 2200 may be implemented to be spaced apart from the plurality of camera modules 2100*a*, 2100*b*, and 2100*c*. For example, the application processor 2200 and the plurality of camera modules 2100*a*, 2100*b*, and 2100*c* may be implemented to be spaced apart from each other by a separate semiconductor chip.

The image processing device 2210 may include a plurality of sub image processors 2212*a*, 2212*b*, and 2212*c*, an image generator 2214, and a camera module controller 2216.

The image processing device 2210 may include the number of a plurality of sub image processors 2212*a*, 2212*b*, and 2212*c* corresponding to the number of the plurality of camera modules 2100*a*, 2100*b*, and 2100*c*.

The image data respectively generated from the camera modules 2100*a*, 2100*b*, and 2100*c* may be provided to their corresponding sub image processors 2212*a*, 2212*b*, and 2212*c* through image signal lines ISLa, ISLb, and ISLc spaced apart from one another. For example, the image data generated from the camera module 2100*a* may be provided to the sub image processor 2212*a* through the image signal line ISLa, the image data generated from the camera module 2100*b* may be provided to the sub image processor 2212*b* through the image signal line ISLb, and the image data generated from the camera module 2100*c* may be provided to the sub image processor 2212*c* through the image signal line ISLc. This image data transmission may be performed using, for example, a Camera Serial Interface (CSI) based on a Mobile Industry Processor Interface (MIPI), but the embodiments are not limited thereto.

Meanwhile, in some embodiments, one sub image processor may be disposed to correspond to the plurality of camera modules. For example, the sub image processor 2212*a* and the sub image processor 2212*c* may be implemented to be combined as one sub image processor without being spaced apart from each other as shown, and the image data provided from the camera module 2100*a* and the camera module 2100*c* may be selected through a selection element (for example, multiplexer), etc. and then may be provided to the combined sub image processor.

The image data provided to each of the sub image processors 2212*a*, 2212*b* and 2212*c* may be provided to the image generator 2214. The image generator 2214 may generate an output image by using the image data provided from each of the sub image processors 2212*a*, 2212*b* and 2212*c* in accordance with image generating information or a mode signal.

For example, the image generator 2214 may merge at least a portion of the image data generated from the camera modules 2100*a*, 2100*b*, and 2100*c* having their respective viewing angles different from one another to generate an output signal in accordance with the image generating information or the mode signal. Also, the image generator 2214 may select any one of the image data generated from the camera modules 2100*a*, 2100*b*, and 2100*c* having their respective viewing angles different from one another to generate the output image in accordance with the image generating information or the mode signal.

In some embodiments, the image generating information may include a zoom signal and/or a zoom factor. Also, in some embodiments, the mode signal may be, for example, a signal based on a mode selected from a user.

When the image generating information is a zoom signal (zoom factor) and the camera modules 2100*a*, 2100*b*, and 2100*c* have their respective field of views (viewing angles) different from one another, the image generator 2214 may perform different operations in accordance with a type of the zoom signal. For example, when the zoom signal is a first signal, the image data output from the camera module 2100*a* and the image data output from the camera module 2100*c* may be merged with each other and then an output image may be generated using the merged image signal and the image data output from the camera module 2100*b* that is not used for merge. When the zoom signal is a second signal different from the first signal, the image generator 2214 may select any one of the image data output from the camera modules 2100*a*, 2100*b* and 2100*c* to output the output image without performing such image data merge. However, the embodiments are not limited to this case, and the method for processing the image data may be carried out by being modified at any time if necessary.

In some embodiments, the image generator 2214 may receive a plurality of image data of which exposure timings are different from one another, from at least one of the plurality of sub image processors 2212*a*, 2212*b*, and 2212*c*, and may perform high dynamic range (HDR) processing for the plurality of image data to generate merged image data with an increased dynamic range.

The camera module controller 2216 may provide control signals to each of the camera modules 2100*a*, 2100*b*, and 2100*c*. The control signals generated from the camera module controller 2216 may be provided to their corresponding camera modules 2100*a*, 2100*b*, and 2100*c* through control signal lines CSLa, CSLb, and CSLc spaced apart from one another.

Any one of the plurality of camera modules 2100*a*, 2100*b*, and 2100*c* may be designated as a master camera (for example, 2100*a*) in accordance with the image generating information including a zoom signal, or the mode signal, and the other camera modules (for example, 2100*b* and 2100*c*) may be designated as slave cameras. This information may be included in the control signals and then provided to the corresponding camera modules 2100*a*, 2100*b*, and 2100*c* through the control signal lines CSLa, CSLb, and CSLc spaced apart from one another.

The camera modules operating as master or slave cameras may be changed in accordance with the zoom factor or operation mode signal. For example, when a viewing angle of the camera module 2100*a* is wider than that of the camera module 2100*c* and the zoom factor indicates a low zoom ratio, the camera module 2100*c* may operate as a master camera, and the camera module 2100*a* may operate as a slave camera. On the contrary, when the zoom factor indicates a high zoom ratio, the camera module 2100*a* may operate as a master camera and the camera module 2100*b* may operate as a slave camera.

In some embodiments, the control signal provided from the camera module controller 2216 to each of the camera modules 2100*a*, 2100*b*, and 2100*c* may include a sync enable signal. For example, when the camera module 2100*b* is a master camera and the camera modules 2100*a* and 2100*c* are slave cameras, the camera module controller 2216 may transmit the sync enable signal to the camera module 2100*b*. The camera module 2100*b* that has received the sync enable signal may generate a sync signal based on the sync enable signal and provide the generated sync signal to the camera modules 2100*a* and 2100*c* through a sync signal line SSL. The camera module 2100*b* and the camera modules 2100*a* and 2100*c* may be synchronized with the sync signal and transmit the image data to the application processor 2200.

In some embodiments, the control signals provided from the camera module controller 2216 to the plurality of camera modules 2100*a*, 2100*b*, and 2100*c* may include mode information based on a mode signal. Based on the mode information, the plurality of camera modules 2100*a*, 2100*b*, and 2100*c* may operate in a first operation mode and a second operation mode regarding a sensing speed.

In the first operation mode, the plurality of camera modules 2100*a*, 2100*b*, and 2100*c* may generate an image signal at a first speed (for example, generate an image signal of a first frame rate), encode the generated image signal at a second speed higher than the first speed (for example, encode an image signal of a second frame rate higher than the first frame rate), and transmit the encoded image signal to the application processor 2200. At this time, the second speed may be 30 times or less of the first speed.

The application processor 2200 may store the received image signal (e.g., the encoded image signal) in the internal memory 2230 and/or the storage 2400 outside the application processor 2200. Afterwards, the application processor 2200 may read out and decode the encoded image signal from the memory 2230 or the storage 2400 and display image data generated based on the decoded image signal. For example, a corresponding one of the plurality of sub processors 2212*a*, 2212*b* and 2212*c* of the image processing device 2210 may perform decoding and may also perform image processing for the decoded image signal. For example, the image data generated based on the decoded image signal may be displayed on the display 2500.

In the second operation mode, the plurality of camera modules 2100*a*, 2100*b*, and 2100*c* may generate an image signal at a third speed lower than the first speed (for example, generate an image signal of a third frame rate lower than the first frame rate) and transmit the generated image signal to the application processor 2200. The image signal provided to the application processor 2200 may be a signal that is not encoded. The application processor 2200 may perform image processing for the received image signal or store the image signal in the memory 2230 or the storage 2400.

The PMIC 2300 may supply a power, for example, a power voltage, to each of the plurality of camera modules 2100*a*, 2100*b*, and 2100*c*. For example, the PMIC 2300 may supply a first power to the camera module 2100*a* through a power signal line PSLa, supply a second power to the camera module 2100*b* through a power signal line PSLb and supply a third power to the camera module 2100*c* through a power signal line PSLc, under the control of the application processor 2200.

The PMIC 2300 may generate a power corresponding to each of the plurality of camera modules 2100*a*, 2100*b*, and 2100*c* and/or adjust a level of the power in response to a power control signal PCON from the application processor 2200. The power control signal PCON may include a power adjustment signal per operation mode of the plurality of camera modules 2100*a*, 2100*b*, and 2100*c*. For example, the operation mode may include a lower power mode. At this time, the power control signal PCON may include information on a camera module operating in a lower power mode and a power level that is set. Levels of the powers respectively provided to the plurality of camera modules 2100*a*, 2100*b* and 2100*c* may be equal to or different from one another. Also, the level of the power may dynamically be changed.

In concluding the detailed description, those skilled in the art will appreciate that many variations and modifications may be made to the preferred embodiments without substantially departing from the principles of the present invention. Therefore, the disclosed example embodiments of the invention are used in a generic and descriptive sense only and not for purposes of limitation.

What is claimed is:

1. An image sensor comprising:
- a first semiconductor substrate including a first surface and a second surface opposite to the first surface;
- a photoelectric conversion layer in the first semiconductor substrate;
- a color filter on the first surface of the first semiconductor substrate;
- a micro lens covering the color filter;
- a first transistor on the second surface, the first transistor including a first gate structure adjacent to the photoelectric conversion layer, the first gate structure including a first gate electrode;
- a first insulating layer on the second surface;
- a second semiconductor substrate including a third surface in contact with the first insulating layer and a fourth surface opposite to the third surface, the second semiconductor substrate including a gate trench exposing at least a portion of the first gate electrode;
- a second transistor on the fourth surface, the second transistor including a second gate structure;
- a second insulating layer on the fourth surface; and
- a metal layer in the second insulating layer,
- wherein the first gate electrode is electrically connected with the metal layer via a first contact different from the first gate electrode and electrically contacting the metal layer and the first gate structure,
- wherein a width of the gate trench is greater than a width of an upper surface of the first gate electrode, and
- wherein a lower surface of the second gate structure is on the fourth surface, and an upper surface of the second gate structure and an upper surface of the first gate structure extend in a direction parallel to a surface of the second insulating layer.

2. The image sensor of claim 1, wherein an uppermost surface of the first gate structure protrudes past the fourth surface.

3. The image sensor of claim 2, wherein the uppermost surface of the first gate structure is between an uppermost surface of the second gate structure and the fourth surface.

4. The image sensor of claim 2, wherein the uppermost surface of the first gate structure is at a same height as an uppermost surface of the second gate structure.

5. The image sensor of claim 2, wherein the second insulating layer includes at least a portion of the first contact.

6. The image sensor of claim 5, wherein the second insulating layer further includes a second contact between the metal layer and the second gate structure, the second contact electrically connecting the metal layer and the second gate structure.

7. The image sensor of claim 5, wherein the first insulating layer does not include a metal line, extended in parallel with the first insulating layer, between the first semiconductor substrate and the second semiconductor substrate.

8. The image sensor of claim 1, wherein the second semiconductor substrate includes a thickness within a range of 5 nm to 10 nm in a vertical direction when viewed in cross-section.

9. The image sensor of claim 1, wherein the second transistor is configured to operate as at least one of a reset transistor, a source follower transistor, or a selection transistor.

10. An image sensor including:

a first semiconductor substrate including a first surface and a second surface opposite to the first surface;

a photoelectric conversion layer in the first semiconductor substrate;

a color filter on the first surface;

a micro lens covering the color filter;

a first transistor on the second surface of the first semiconductor substrate, the first transistor including a first gate structure adjacent to the photoelectric conversion layer, the first gate structure including a first gate electrode;

a first insulating layer on the second surface;

a second semiconductor substrate including a third surface, which is in contact with the first insulating layer, and a fourth surface opposite to the third surface, the second semiconductor substrate including a gate trench exposing the first gate electrode;

a second transistor on the fourth surface of the second semiconductor substrate, the second transistor including a second gate structure;

a second insulating layer on the fourth surface of the second semiconductor substrate; and a metal layer in the second insulating layer, wherein the first gate electrode is electrically connected with the metal layer via a first contact different from the first gate electrode and electrically contacting the metal layer and the first gate structure, and wherein the first gate electrode protrudes past the fourth surface.

11. The image sensor of claim 10, wherein a lower surface of the second gate structure is on the fourth surface, and an upper surface of the second gate structure and an upper surface of the first gate structure extend in a direction parallel to a surface of the second insulating layer.

12. The image sensor of claim 10, wherein an uppermost surface of the first gate structure is between an uppermost surface of the second gate structure and the fourth surface.

13. The image sensor of claim 10, wherein an uppermost surface of the first gate structure is at a same height as that of an uppermost surface of the second gate structure.

14. The image sensor of claim 10, wherein the second insulating layer includes at least a portion of the first contact.

* * * * *